United States Patent
Cho et al.

(10) Patent No.: US 10,637,502 B2
(45) Date of Patent: *Apr. 28, 2020

(54) STORAGE DEVICE AND OPERATING METHOD OF STORAGE DEVICE

(71) Applicant: SAMSUNG ELECTRONICS CO., LTD., Suwon-si, Gyeonggi-Do (KR)

(72) Inventors: Yongwon Cho, Suwon-si (KR); Hyunsoo Bae, Seoul (KR); Hyotaek Leem, Suwon-si (KR); Dong-Ryoul Lee, Incheon (KR); Hyun Ju YI, Hwaseong-si (KR); Taehack Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 59 days.

This patent is subject to a terminal disclaimer.

(21) Appl. No.: 16/116,500

(22) Filed: Aug. 29, 2018

(65) Prior Publication Data

US 2019/0036546 A1    Jan. 31, 2019

Related U.S. Application Data

(63) Continuation of application No. 15/379,110, filed on Dec. 14, 2016, now Pat. No. 10,090,858.

(30) Foreign Application Priority Data

Dec. 14, 2015  (KR) .................. 10-2015-0178369

(51) Int. Cl.
*H03M 13/00* (2006.01)
*H03M 13/09* (2006.01)
(Continued)

(52) U.S. Cl.
CPC ......... *H03M 13/09* (2013.01); *G06F 11/1012* (2013.01); *G06F 11/1044* (2013.01);
(Continued)

(58) Field of Classification Search
None
See application file for complete search history.

(56) References Cited

U.S. PATENT DOCUMENTS 7,343,470 B1    3/2008  Joyce et al.
7,679,133 B2    3/2010  Son et al.
(Continued)

OTHER PUBLICATIONS

P. Subedi, P. Huang, X. He, M. Zhang and J. Han, "A hybrid erasure-coded ECC scheme to improve performance and reliability of solid state drives," 2014 IEEE 33rd International Performance Computing and Communications Conference (IPCCC), Austin, TX, 2014, pp. 1-8.doi: 10.1109/PCCC.2014.7017095 (Year: 2014).*

*Primary Examiner* — Daniel F. McMahon
(74) *Attorney, Agent, or Firm* — Volentine, Whitt & Francos, PLLC

(57) ABSTRACT

A storage device includes a nonvolatile memory device and a controller configured to read data from the nonvolatile memory device, to divide the read data into a plurality of segments, and to sequentially perform error correction decoding with respect to the plurality of segments. When the error correction decoding of each segment is completed, the controller adds error correction parity to each of the decoded segments and sends the decoded segments with added error correction parity to an external host device. When error correction decoding of a second segment is not completed after a threshold time has elapsed after sending a first segment of which error correction decoding is completed, the controller adds an incorrect error correction parity to dummy data and sends the dummy data with the added incorrect error correction parity to the external host device.

20 Claims, 15 Drawing Sheets

(51) Int. Cl.
  *G06F 11/10* (2006.01)
  *H03M 13/29* (2006.01)
  *H03M 13/37* (2006.01)
  *H03M 13/11* (2006.01)
  *H03M 13/13* (2006.01)
  *H03M 13/15* (2006.01)
  *H03M 13/19* (2006.01)

(52) U.S. Cl.
  CPC ....... *H03M 13/29* (2013.01); *H03M 13/2906* (2013.01); *H03M 13/3761* (2013.01); *H03M 13/1102* (2013.01); *H03M 13/13* (2013.01); *H03M 13/152* (2013.01); *H03M 13/1515* (2013.01); *H03M 13/19* (2013.01); *H03M 13/2957* (2013.01)

(56) References Cited

U.S. PATENT DOCUMENTS

| | | | |
|---|---|---|---|
| 8,125,834 B2 | 2/2012 | Lofgren et al. | |
| 8,438,453 B2 | 5/2013 | Post et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,898,352 B2 | 11/2014 | Cho et al. | |
| 2004/0054651 A1* | 3/2004 | Katayama | G11B 20/1833 |
| 2005/0071570 A1 | 3/2005 | Takasugl et al. | |
| 2010/0088463 A1 | 4/2010 | Im et al. | |
| 2011/0066768 A1 | 3/2011 | Brittner et al. | |
| 2011/0231598 A1 | 9/2011 | Hatsuda | |
| 2011/0233648 A1 | 9/2011 | Seol et al. | |
| 2012/0260149 A1* | 10/2012 | Chang | G06F 11/1068 714/773 |
| 2013/0179632 A1 | 7/2013 | Ben-Shemesh et al. | |
| 2014/0013187 A1* | 1/2014 | Blaunstein | G06F 13/1689 714/773 |
| 2014/0157086 A1 | 6/2014 | Sharon et al. | |
| 2014/0164867 A1* | 6/2014 | Kaynak | G06F 11/10 714/763 |
| 2015/0046772 A1* | 2/2015 | Bennett | G06F 11/0787 714/768 |
| 2015/0234756 A1 | 8/2015 | Tuers et al. | |

* cited by examiner

FIG. 12
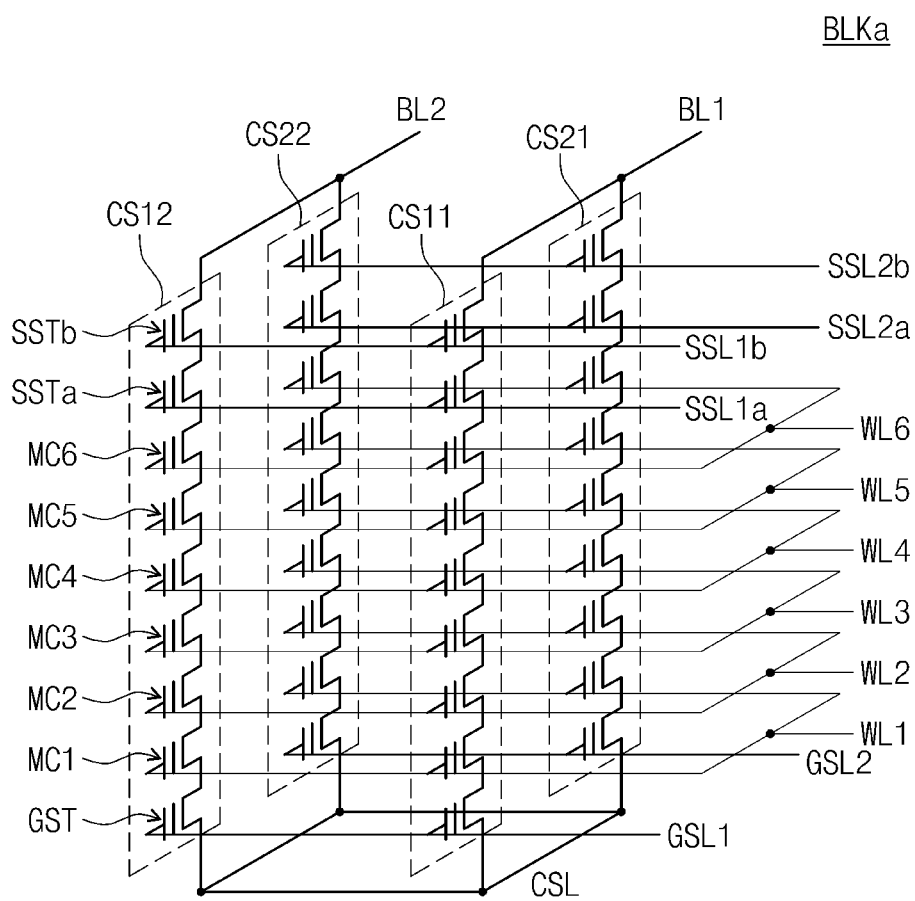
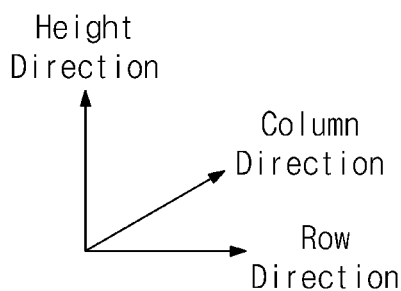

STORAGE DEVICE AND OPERATING METHOD OF STORAGE DEVICE

CROSS-REFERENCE TO RELATED APPLICATIONS

This is a Continuation of U.S. application Ser. No. 15/379,110, filed Dec. 14, 2016, in which a claim for priority under 35 U.S.C. § 119 is made to Korean Patent Application No. 10-2015-0178369 filed Dec. 14, 2015, in the Korean Intellectual Property Office, the disclosure of which is incorporated herein in its entirety by reference.

BACKGROUND

The inventive concepts described herein relate to a semiconductor memory, and more particularly to a storage device and an operating method thereof.

Storage devices may be referred to as any devices which store data under control of a host device such as a computer, a smart phone, a smart pad or the like. Hard disk drives (HDD) are storage devices capable of storing data on a magnetic disk. Solid state drives (SSD), memory cards, or the like are examples of storage devices which store data in semiconductor memory.

Examples of nonvolatile memory include read only memory (ROM), programmable ROM (PROM), electrically programmable ROM (EPROM), electrically erasable and programmable ROM (EEPROM), flash memory devices, phase-change RAM (PRAM), magnetic RAM (MRAM), resistive RAM (RRAM), ferroelectric RAM (FRAM) or the like.

The operating speed of a host device such as a computer, a smart phone, a smart pad or the like that communicates with the storage device continues to improve as semiconductor manufacturing technologies develop. The volume of content used in storage devices and used by host devices continues to increase. For these reasons, demand for storage devices with improved operating speed has continuously trended upward.

SUMMARY

Embodiments of the inventive concept provide a storage device that has an improved operating speed while maintaining reliability, and an operating method thereof.

Embodiments of the inventive concept provide a storage device including a nonvolatile memory device; and a controller configured to read data from the nonvolatile memory device, to divide the read data into a plurality of segments, and to sequentially perform error correction decoding with respect to the plurality of segments. Upon determination of completion of the error correction decoding of each segment, the controller is configured to add an error correction parity to each of the decoded segments and send the decoded segments with the added error correction parity to an external host device. Upon determination that error correction decoding of a second segment is not complete after a threshold time has elapsed from when error correction decoding and sending of a first segment were completed, the controller is configured to add an incorrect error correction parity to dummy data and send the dummy data with the added incorrect error correction parity to the external host device.

Embodiments of the inventive concept provide a storage device including a plurality of storage clusters; a random access memory; and a mass controller configured to control the plurality of storage clusters. Each of the plurality of storage clusters includes a plurality of nonvolatile memory devices, and a controller configured to read data from each of the plurality of nonvolatile memory devices, to divide the read data into a plurality of segments, and to sequentially perform error correction decoding with respect to the plurality of segments. Upon determination of completion of the error correction decoding of each segment, the controller is configured to add error correction parity to each of the decoded segments and send the decoded segments with the added error correction parity to the mass controller. Upon determination that error correction decoding of a second segment is not complete after a threshold time has elapsed from when error correction decoding and sending of a first segment were completed, the controller is configured to add an incorrect error correction parity to dummy data and send the dummy data with the added incorrect error correction parity to the mass controller.

Embodiments of the inventive concept provide an operating method of a storage device that includes a nonvolatile memory device and a controller configured to control the nonvolatile memory device. The method includes reading a plurality of segments from the nonvolatile memory device at the controller; and performing error correction decoding sequentially with respect to the plurality of segments at the controller and sending each segment having completed error correction decoding to an external host device. Upon determination by the controller that error correction decoding of a second segment is not completed after a threshold time has elapsed from when a first segment was sent to the external host device, sending dummy data and an incorrect error correction parity to the external host device.

Embodiments of the inventive concept provide a storage device including a nonvolatile memory device; and a controller configured to read data from the nonvolatile memory device, perform error correction decoding on segments of the read data, send the decoded segments to an external host device, and send dummy data with incorrect error correction parity to the external host device in place of a corresponding segment of the read data upon determination that error correction decoding of the corresponding segment is not complete after a threshold time has elapsed.

BRIEF DESCRIPTION OF THE FIGURES

The above and other objects and features will become apparent from the following description with reference to the following figures, wherein like reference numerals refer to like parts throughout the various figures unless otherwise specified, and wherein

FIG. 12 illustrates a circuit diagram of a memory block according to an embodiment of the inventive concept;

DETAILED DESCRIPTION

Below, embodiments of the inventive concept will be described in detail with reference to the attached drawings to the extent that the embodiments of the inventive concept are easily implemented by a person of ordinary skill in the art to which the inventive concept belongs.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
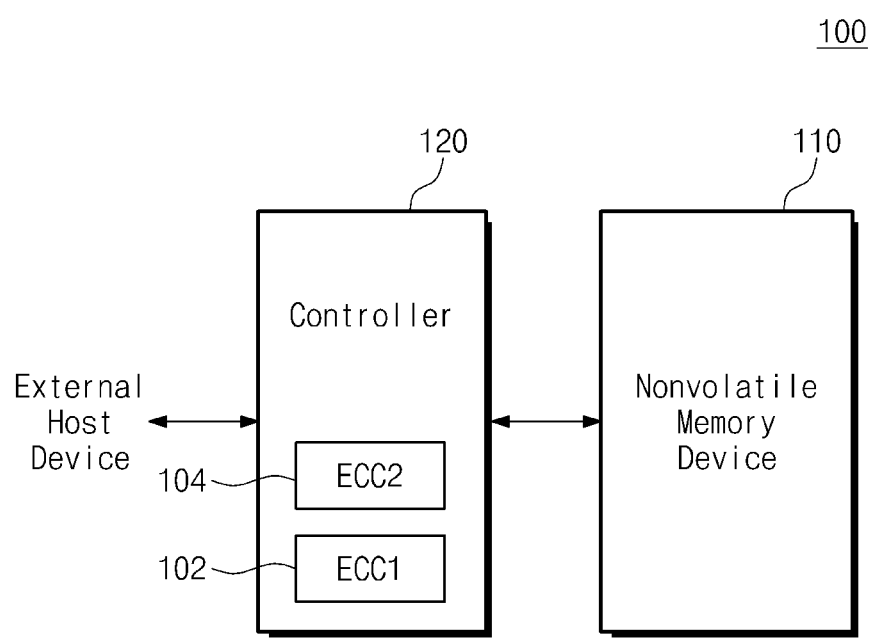
FIG. 1 illustrates a block diagram of a storage device according to an embodiment of the inventive concept.

FIG. 1 illustrates a block diagram of a storage device 100 according to an embodiment of the inventive concept. Referring to FIG. 1, the storage device 100 includes a nonvolatile memory device 110 and a controller 120.

The nonvolatile memory device 110 may perform writing, reading and erasing under control of the controller 120. The nonvolatile memory device 110 may receive a command and an address from the controller 120 through an input/output channel. The nonvolatile memory device 110 may exchange data with the controller 120 through the input/output channel.

The nonvolatile memory device 110 may exchange a control signal with the controller 120 through a control channel. For example, the nonvolatile memory device 110 may receive, from the controller 120, at least one of a chip enable signal /CE for selecting at least one of a plurality of nonvolatile memory chips in the nonvolatile memory device 110, a command latch enable signal CLE indicating that a signal received from the controller 120 through the input/output channel is the command, an address latch enable signal ALE indicating that a signal received from the controller 120 through the input/output channel is an address, a read enable signal /RE that is generated by the controller 120 at a read operation and periodically toggled and used to tune timing, a write enable signal /WE activated by the controller 120 when a write command or the address is transmitted, a write protection signal /WP activated by the controller 120 to prevent unintended writing or erasing when a power changes, and a data strobe signal DQS that is generated by the controller 120 at a write operation and periodically toggled and used to adjust input synchronization about the data transmitted through the input/output channel. For example, the nonvolatile memory device 110 may output, to the controller 120, at least one of a ready/busy signal R/nB indicating whether the nonvolatile memory device 110 is performing a program, erase or read operation, and a data strobe signal DQS used to adjust output synchronization about the data and generated from the read enable signal /RE by the nonvolatile memory device 110 so as to be periodically toggled.

The nonvolatile memory device 110 may include a flash memory. However, in other embodiments the nonvolatile memory device 110 may for example incorporate at least one of nonvolatile memory devices such as phase-change RAM (PRAM), magnetic RAM (MRAM), resistive RAM (RRAM), and ferroelectric RAM (FeRAM), or the like.

The memory controller 120 may be configured to access the nonvolatile memory device 110. For example, the controller 120 may control the nonvolatile memory device 110 through the input/output channel and the control channel so as to perform a write, read or erase operation.

The controller 120 may control the nonvolatile memory device 110 in response to control of an external host device (not illustrated). For example, the controller 120 may communicate with the external host device based on a format the same as or different from the format for communications with the nonvolatile memory device 110. A unit of data which the controller 120 conveys to the nonvolatile memory device 110 may be different from a unit of data which the controller 120 conveys to the external host device.

The controller 120 includes a first error correction code block ECC1 102 and a second error correction code block ECC2 104. The first error correction code block ECC1 102 may perform error correction encoding with respect to data to be written at the nonvolatile memory device 110, and may perform error correction decoding with respect to data received from the nonvolatile memory device 110. That is, the first error correction code block ECC1 102 corrects errors that are generated from the nonvolatile memory device 110 and errors generated in a channel between the nonvolatile memory device 110 and the controller 120. For example, the first error correction code block ECC1 102 performs error correction encoding and decoding based on at least one of various error correction codes such as for example a Bose-Chaudhuri-Hocquenghem (BCH) code, a Reed-Solomon (RS) code, a turbo code, a Low Density Parity Check (LDPC) code, and a polar code, or the like.

The second error correction code block ECC2 104 may perform error correction decoding with respect to data received from the external host device, and may perform error correction encoding with respect to data to be output to the external host device. That is, the second error correction code block ECC2 104 corrects errors that are generated from a channel between the external host device and the controller 120. For example, the second error correction code block ECC2 104 performs error correction encoding and decoding based on a Cyclic Redundancy Check (CRC) code.

In an embodiment, the nonvolatile memory device 110 may be controlled directly by the external host device. For example, the nonvolatile memory device 110 may receive a chip enable signal /CE, a command latch enable signal CLE, an address latch enable signal ALE, a read enable signal /RE, a write enable signal /WE, a write protection signal /WP, and a data strobe signal DQS directly from the external host device or through the controller 120 there from. The nonvolatile memory device 110 may output a ready/busy signal R/nB and a data strobe signal DQS directly to the external host device or to the external host device through the controller 120. The nonvolatile memory device 110 may receive a physical address from the external host device and may use the received physical address without modification to perform a read, a write, or an erase operation. When data is exchanged between the external host device and the nonvolatile memory device 110, the controller 120 may be configured to perform error correction encoding and decoding.

The nonvolatile memory device 110 may include a plurality of nonvolatile memory chips. In an embodiment, the controller 120 and the nonvolatile memory chips may be interconnected based on a channel and a way. One channel may for example include one data channel and one control channel One data channel may for example include eight data lines. One control channel may for example include control lines for transmitting the chip enable signal (/CE), the command latch enable signal (CLE), the address latch enable signal (ALE), the read enable signal (/RE), the write enable signal (/WE), the write protect signal (/WP), and the ready/busy signal (R/nB).

Nonvolatile memory chips connected to one channel may constitute a way. N nonvolatile memory chips that are connected to one channel may constitute an n-way. Nonvolatile memory chips that belong to one way may share data lines and the control lines for transmitting the command latch enable signal CLE, the address latch enable signal ALE, the read enable signal /RE, the write enable signal /WE, and the write protect signal /WP. Each of nonvolatile memory chips belonging to one way may communicate with the controller 120 through dedicated control lines for transmitting the chip enable signal /CE and the ready/busy signal R/nB.

The controller 120 may alternately access n-way nonvolatile memory chips connected to one channel. The controller 120 may independently access nonvolatile memory chips connected with different channels. The controller 120 may alternately or simultaneously access nonvolatile memory chips connected with different channels.

In an embodiment, the nonvolatile memory chips may be connected with the controller 120 in the form of a wide IO. For example, nonvolatile memory chips connected to different channels may share a control line for the chip enable signal /CE. Nonvolatile memory chips which share the control line for the chip enable signal /CE may be accessed at the same time. Because data lines of different channels are used at the same time, a wide input/output bandwidth may be achieved.

The storage device 100 may include a solid state drive (SSD) or a hard disk drive (HDD). The storage device 100 may include memory cards, such as for example a PC card (personal computer memory card international association (PCMCIA)), a compact flash (CF) card, a smart media card (e.g., SM, SMC), a memory stick, a multimedia card (e.g., MMC, RS-MMC, MMCmicro), an SD card (e.g., SD, miniSD, microSD, SDHC), a universal serial bus (USB) memory card, and a universal flash storage (UFS), or the like. The storage device 100 may include embedded memories, such as for example an embedded MultiMedia card (eMMC), a UFS, and a PPN (Perfect Page NAND).

Figure 2:
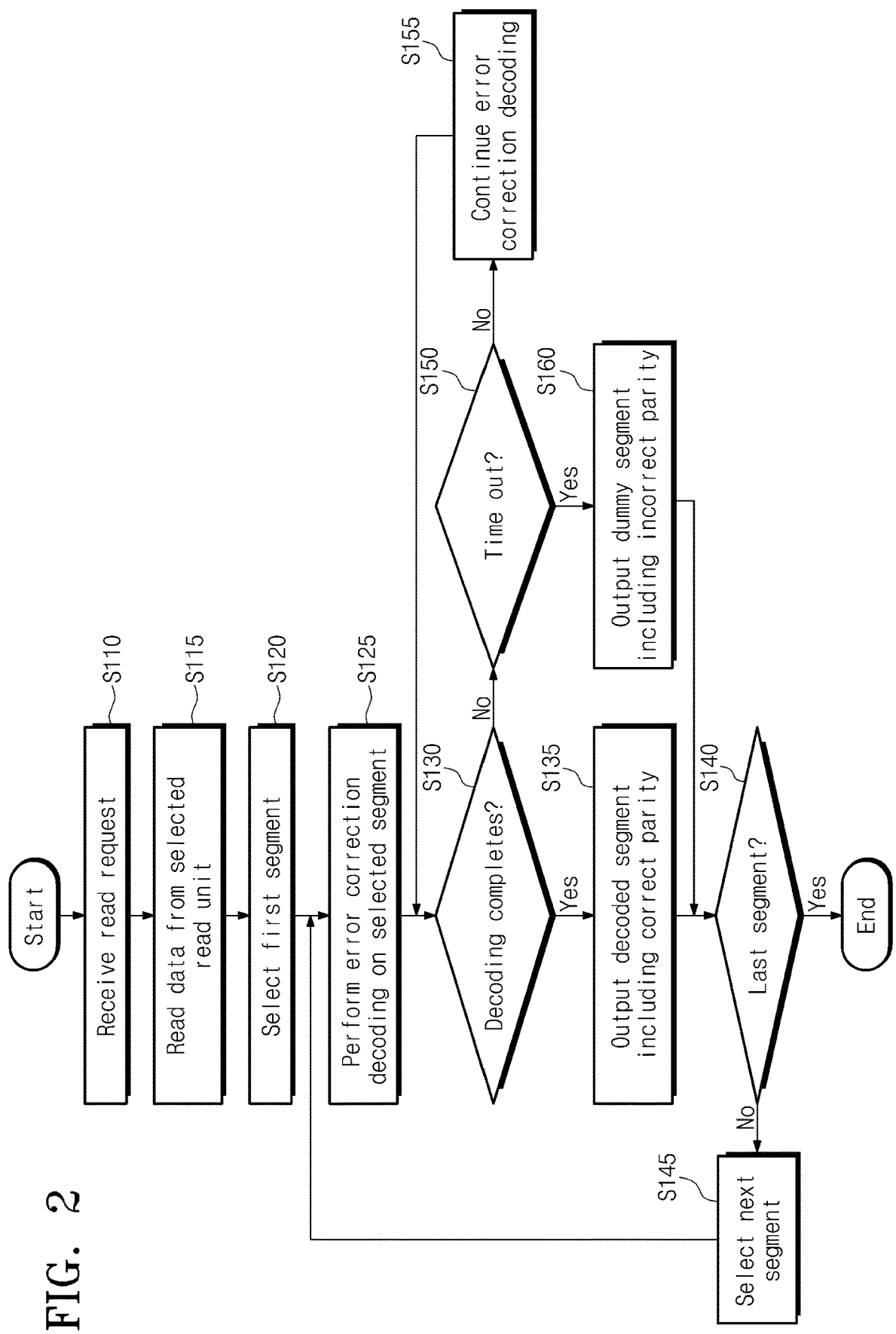
FIG. 2 illustrates a flowchart of an operating method of the storage device according to an embodiment of the inventive concept.

FIG. 2 illustrates a flowchart of an operating method of the storage device according to an embodiment of the inventive concept. Referring to FIGS. 1 and 2, in step S110 the storage device 100 receives a read request. For example, the nonvolatile memory device 110 may receive the read request directly from the external host device (not shown) or through the controller 120 from the external host device. The received read request may be used to request a read operation that is performed by a read unit of the storage device 100 or the nonvolatile memory device 110 or performed by a partial read unit smaller than the read unit. For example, the read unit may refer to a unit of data that is output through one read operation that the nonvolatile memory device 110 performs in response to a read request.

In step S115, the nonvolatile memory device 110 reads data of the read unit or the partial read unit in response to the read request. The unit or the partial read unit selected may for example be from a selected storage cluster, which will be subsequently described with respect to FIG. 13. The read data may be provided to the controller 120.

In step S120, the controller 120 selects a first segment from among the read data as a selected segment. For example, a segment may be a unit of data of which the error correction encoding and decoding is performed. Data of the read unit or the partial read unit may include two or more segments. The controller 120 may select the first segment among a plurality of segments of the read unit or the partial read unit sent from the nonvolatile memory device 110.

In step S125, the controller 120 performs error correction decoding with respect to the selected segment. For example, the controller 120 may perform error correction decoding using the first error correction code block ECC1 102.

In step S130, the controller 120 determines whether the error correction decoding of the selected segment is completed. If the error correction decoding of the selected segment is completed (Yes in step S130), in step S135 the controller 120 thereafter outputs a decoded segment, which includes a correct parity, to the external host device. For example, when error correction decoding of a current segment is completed, the controller 120 outputs the decoded current segment regardless of whether error correction decoding about another segment of the read data is completed. In an embodiment, the correct parity may be a parity that is normally generated by the second error correction code block ECC2 104 based on the decoded segment. For example, the correct parity may be a parity that is identified by the external host device to indicate that an error is absent in a segment sent together with the correct parity.

In step S140, the controller 120 determines if the selected segment is a last segment. If the selected segment is a last segment from among the read data (Yes in step S140), a read operation corresponding to the read request ends. If the selected segment is not the last segment from among the read data (No in step S140), another segment from among the read data is selected in step S145, and the process thereafter proceeds to step S125.

In step S130, if the controller 120 determines that the error correction decoding is not completed (No in step S130), the process proceeds to step S150. In step S150 the controller 120 determines whether a timeout is generated. For example, when error correction decoding of a current segment is not completed after a threshold time has elapsed from when a previous decoded segment has been output, the controller 120 determines that a timeout has occurred. In an embodiment, the threshold time may be a time that is determined by the external host device. In other embodiments, the threshold time may for example be a time that is determined by an operating property or specification of the nonvolatile memory device 110 or the storage device 100. For example, the threshold time may be "immediately".

If the controller 120 determines that no timeout occurs (No in step S150), the controller 120 thereafter in step S155 continues to perform the error correction decoding and the process thereafter proceeds to step S130. If the controller 120 determines that timeout has occurred (Yes in step S150), the controller 120 thereafter in step S160 outputs a dummy segment, which includes an incorrect parity, to the external host device. For example, while the dummy segment is output, the controller 120 may continue to perform the error correction decoding so as to complete the error decoding. Afterward outputting the dummy segment in step S160, the process proceeds to step S140. In steps S140 and S145, the current segment may be re-selected, and the error correction decoding for the current segment may continue. In an embodiment, the incorrect parity may be a parity that is different from a parity normally generated by the second error correction code block ECC2 104 based on the decoded segment. For example, the incorrect parity may be a parity that is identified by the external host device to indicate that an error is present in a segment sent together with the incorrect parity.

Figure 3:
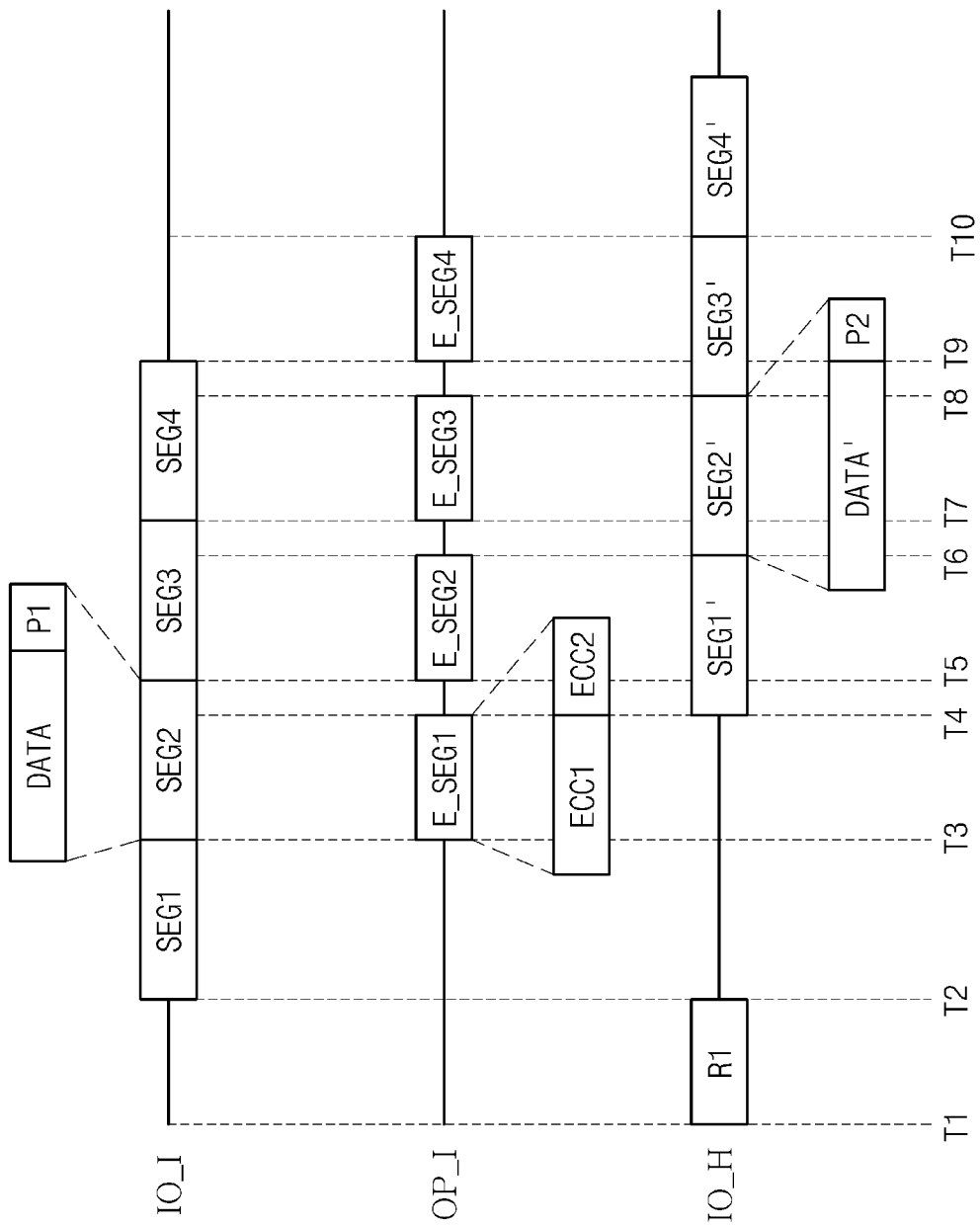
FIG. 3 illustrates a timing diagram of operations that the storage device performs when an error correction operation is performed without a delay.

FIG. 3 illustrates a timing diagram of operations that the storage device 100 performs when an error correction operation is performed without a delay. In FIG. 3, the abscissa represents a time, and the ordinate represents statuses of a host input/output channel IO_H, an internal operation OP_I, and an internal input/output channel IO_I. The host input/output channel IO_H indicates signals that are exchanged between the storage device 100 and the external host device. The internal operation OP_I indicates an internal operation of the controller 120, in particular, operations performed by the first error correction code block ECC1 102 and the second error correction code block ECC2 104. The internal input/output channel IO_I indicates signals that are exchanged between the controller 120 and the nonvolatile memory device 110.

Referring to FIGS. 1 and 3, at time T1, a read request R1 is sent from the external host device to the storage device 100 or the nonvolatile memory device 110. For example, the read request R1 may be sent from the external host device directly to the nonvolatile memory device 110, or to the nonvolatile memory device 110 through the controller 120.

At time T2, the nonvolatile memory device 110 reads data in response to the read request R1 and outputs the read data to the controller 120. For example, data read by the nonvolatile memory device 110 may include first to fourth segments SEG1 to SEG4. The nonvolatile memory device 1100 may continuously output the first to fourth segments SEG1 to SEG4 without a gap. Each segment may include data "DATA" and a first parity P1. The first parity P1 may include additional information that is generated during the error correction encoding by the first error correction code block ECC1 102.

At time T2, the nonvolatile memory device 110 starts outputting the first segment SEG1 to the controller 120. The transmission of the first segment SEG1 as shown is completed at time T3.

At time T3, the nonvolatile memory device 110 starts outputting the second segment SEG2 to the controller 120. Furthermore, as the first segment SEG1 is completely received at time T3, the controller 120 performs an error correction operation E_SEG1 of the first segment SEG1. The error correction operation E_SEG1 of the first segment SEG1 may include error correction decoding by the first error correction code block ECC1 102 and error correction encoding by the second error correction code block ECC2 104. The first error correction code block ECC1 102 may perform error correction decoding based on the first parity P1. The second error correction code block ECC2 104 may perform error correction encoding to generate a second parity P2.

In an embodiment, the error correction operation E_SEG1 is ended before the second segment SEG2 is completely transmitted. As the error correction operation E_SEG1 of the first segment SEG1 is completed at time T4, the controller 120 outputs the decoded first segment SEG1' to the external host device beginning at time T4. The decoded segment may include decoded data DATA' and a second parity P2 added by second error correction code block ECC2 104.

Afterwards, the transmission of the second segment SEG2 is completed at T5. The nonvolatile memory device 110 starts transmitting a third segment SEG3 to the controller 120 at time T5, and the controller 120 initiates an error correction operation E_SEG2 at time T5. The error correction operation E_SEG2 is completed at time T6. At time T6, the controller 120 outputs a decoded second segment SEG2' to the external host device.

The transmission of the third segment SEG3 to the controller 120 is completed at T7. The nonvolatile memory device 110 starts transmitting a fourth segment SEG4 to the controller 120 at time T7, and the controller 120 initiates an error correction operation E_SEG3 at time T7. The error correction operation E_SEG3 is completed at time T8. At time T8, the controller 120 outputs a decoded third segment SEG3' to the external host device.

The transmission of the fourth segment SEG4 is completed at time T9. The controller 120 initiates an error correction operation E_SEG4 of a fourth segment SEG4 at time T9. The error correction operation E_SEG4 is completed at time T10. At time T10, the controller 120 outputs a decoded fourth segment SEG4' to the external host device.

In an embodiment, the external host device may request the storage device 100 to output the decoded first to fourth segments SEG1' to SEG4', which correspond to a read unit, in response to the read request R1. In some embodiments as described with reference to FIG. 1, the above-described event may occur when the external host device is configured to access the nonvolatile memory device 110 directly. For example, the controller 120 may intervene in control signals that are exchanged between the external host device and the nonvolatile memory device 110. The controller 120 may be configured to perform error correction encoding and decoding with respect to data that is exchanged between the external host device and the nonvolatile memory device 110.

In this case, the external host device may be configured to generate a read request corresponding to a read unit of the nonvolatile memory device 110, to generate a write request corresponding to a write unit, and to generate an erase request corresponding to an erase unit. The external host device may be configured to exchange data with the nonvolatile memory device 110 based on the read unit or the write unit of the nonvolatile memory device 110.

The nonvolatile memory device 110 may be configured to output data of the read unit continuously without a gap. Accordingly, the external host device may be configured to operate under the condition that data of the read unit is output continuously without a gap.

In the case where the external host device and the storage device 100 have the above-described relation, a method in which data corresponding to the read unit is continuously output to the external host device after error correction encoding of data corresponding to the read unit is completed has been used. However, the method may be problematic in that the storage device 100 does not cope with a read request of the external host device quickly.

To solve the above-described issue, as illustrated in FIG. 3, the storage device 100 may initiate error correction decoding when each segment is completely read and may start outputting data to the external host device when error correction encoding of each segment is completed. For example, transmission of first to fourth segments SEG1 to SEG4 from the nonvolatile memory device 110 to the controller 120, error correction operations E_SEG1 to E_SEG4 of the first to fourth segments SEG1 to SEG4 by the controller 120, and transmission of decoded first to fourth segments SEG1' to SEG4' from the controller 120 to the external host device may be performed in a streaming or pipeline way. When a read operation and an error correction operation E_SEG1 about the first segment SEG1 is completed, the storage device 100 may start outputting the decoded segments SEG1' to SEG4'. Accordingly, an initial response time when the storage device 100 responds to a read request of the external host device may be shortened, and an operating speed of the storage device 100 may be improved.

However, the above-described method may have an issue when an error correction operation is delayed. For example, as a use frequency (e.g., an erase or program frequency) of the nonvolatile memory device 110 increases, the reliability of the nonvolatile memory device 110 may decrease, and thus the probability that an error is generated may increase. Furthermore, as a read frequency of the nonvolatile memory device 110 increases, as a time has elapsed after data is written at the nonvolatile memory device 110, or as a peripheral temperature of the nonvolatile memory device 110 increases, the reliability of data written at the nonvolatile memory device 110 may decrease, and thus the probability that an error is generated may increase. As the number of errors generated at each segment increases, a time taken to perform an error correction operation of each segment may increase.

Figure 4:
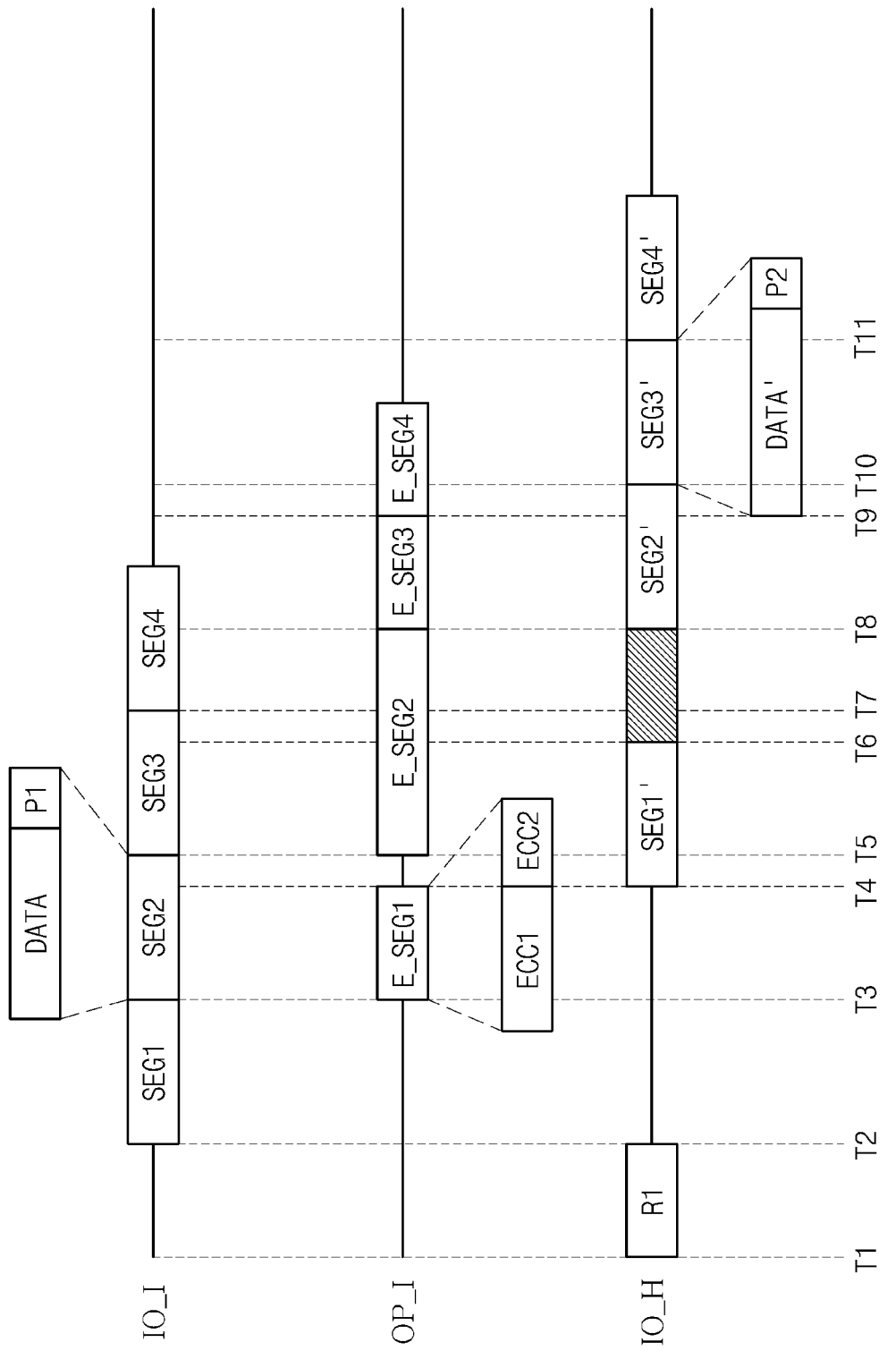
FIG. 4 illustrates a timing diagram of an example in which an error is generated at the storage device when an error correction operation is delayed.

FIG. 4 illustrates a timing diagram of an example in which an error is generated at the storage device 100 when an error correction operation is delayed. Operations performed from times T1 to T5 may be the same as those of FIG. 3, and description thereof is thus omitted.

Referring to FIGS. 1 to 3 and 4, at time T6, the decoded first segment SEG1' is completely transmitted. In FIG. 3, an embodiment of the inventive concept is exemplified as the error correction operation E_SEG2 of the second segment SEG2 is completed after the decoded first segment SEG1' has been completely transmitted. However, in FIG. 4, the error correction operation E_SEG2 of the second segment SEG2 is delayed. For example, after the nonvolatile memory device 110 starts outputting the fourth segment SEG4 to the controller 120 at time T7, at time T8 the error correction operation E_SEG2 of the second segment SEG2 is completed. In this case, the controller 120 outputs the decoded second segment SEG2' at time T8 and initiates the error correction operation E_SEG3 of the third segment SEG3 at time T8. As the error correction operation E_SEG3 is completed at time T9, the controller 120 initiates the error correction operation E_SEG4. The controller 120 outputs the decoded third segment SEG3' at time T10 and outputs the decoded fourth segment SEG4' at T11.

As described above, when the error correction operation E_SEG2 of the second segment SEG2 is delayed, a delay section in which the controller 120 does not transmit data after initiating an output of the decoded data occurs between times T6 and T8. The delay section is illustrated as a slashed box.

The delay section illustrated in FIG. 4 may be processed without an error in an environment in which information is easily exchanged between the external host device and the storage device 100, or between the external host device and the nonvolatile memory device 110. For example, in this case the storage device 100 or the nonvolatile memory device 110 may inform the external host device that an output of data is delayed and thereafter for instance that an output of data is resumed. The external host device may determine a timing to receive data and a timing not to receive data, based on the notification from the storage device 100 or the nonvolatile memory device 110.

However, as described with reference to FIGS. 1 and 3, there is presupposed or required an environment in which the storage device 100 or the nonvolatile memory device 110 continuously output decoded data of the read unit to the external host device without a gap in response to a read request. In this case, transmission of data may be delayed between the storage device 100 and the external host device, or between the nonvolatile memory device 110 and the external host device, and because there is presupposed no need to exchange information indicating retransmission of data there between, a channel for sending corresponding information may not be provided. When the storage device 100 or the nonvolatile memory device 110 starts transmitting decoded data to the external host device, the external host device may continuously receive data of the read unit without a gap under the precondition that decoded data of the read unit is transmitted without a gap. However, in the case that there happens to actually be a gap, the external host device in this case may receive invalid data between times T6 and T8.

To prevent the above-described issue, as described with reference to FIG. 2, the storage device 100 according to an embodiment of the inventive concept may output a dummy segment, which includes dummy data and an incorrect parity, when an error correction operation is delayed after a previous segment is output.

Figure 5:
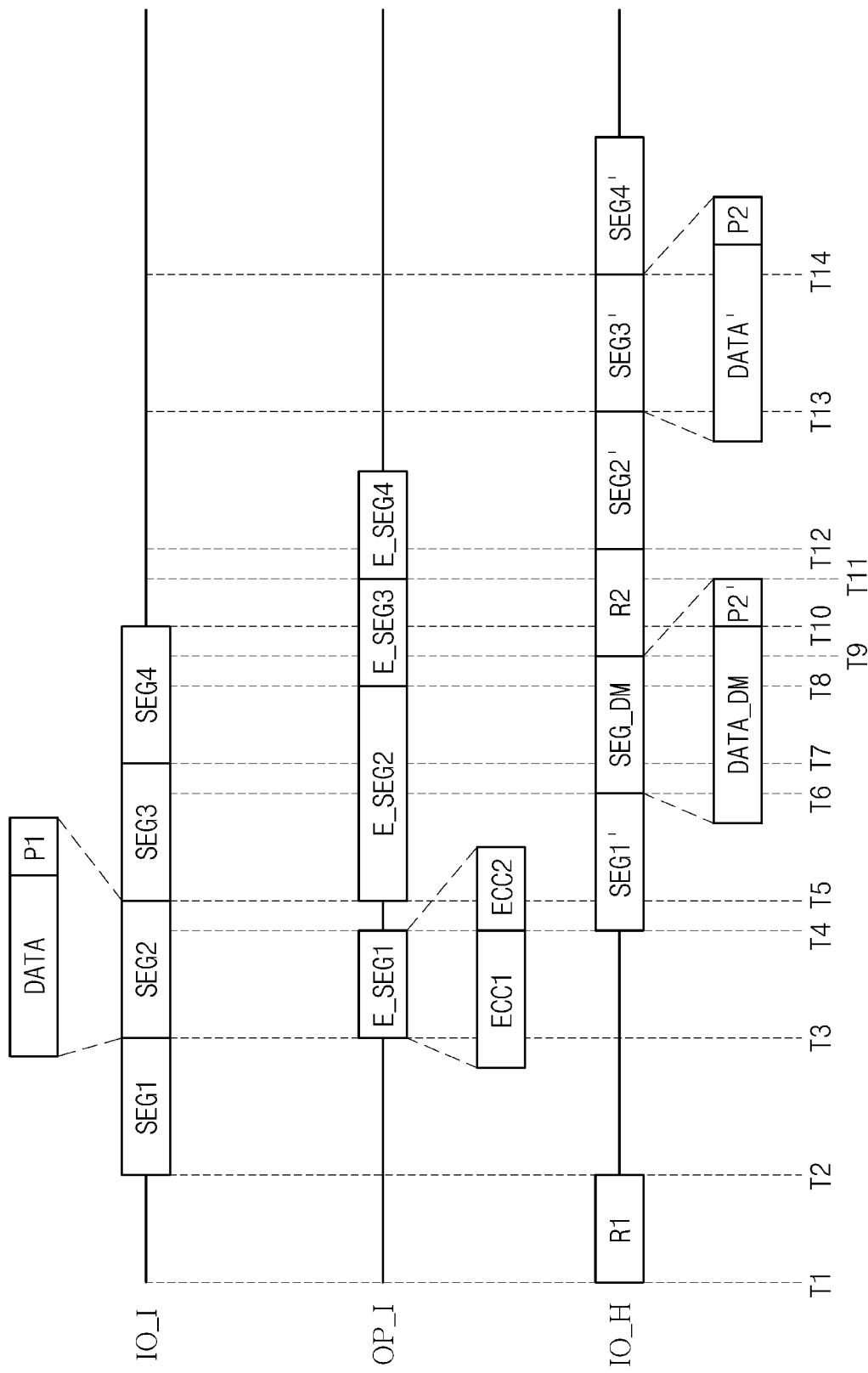
FIG. 5 illustrates a timing diagram of a process in which the storage device according to an embodiment of the inventive concept outputs data in response to a read request.

FIG. 5 illustrates a timing diagram of a process in which the storage device 100 according to an embodiment of the inventive concept outputs data in response to a read request. In FIG. 5, the abscissa represents a time, and the ordinate represents statuses of a host input/output channel IO_H, an internal operation OP_I, and an internal input/output channel IO_I. The host input/output channel IO_H indicates signals that are exchanged between the storage device 100 or the nonvolatile memory device 110 and the external host device. The internal operation OP_I indicates an internal operation of the controller 120, including operations performed by the first error correction code block ECC1 102 and the second error correction code block ECC2 104. The internal input/output channel IO_I indicates signals that are exchanged between the controller 120 and the nonvolatile memory device 110.

Operations performed from times T1 to T5 may be the same as those of FIG. 4, and a description thereof is thus omitted.

Referring to FIGS. 1, 4, and 5, at time T6, the controller 120 completes transmission of the decoded first segment SEG1' to the external host device. At time T6 when a decoded previous segment is completely transmitted, the error correction operation E_SEG2 of a current segment, that is the second segment SEG2, is continuously performed and not yet completed. As described with reference to step S160 of FIG. 2, the controller 120 outputs at time T6 a dummy segment SEG_DM to the external host device that includes an incorrect parity P2' and dummy data DATA_DM. For example, the dummy data DATA_DM may be a stream of bits having the same value, a bit stream of a predefined pattern, or a bit stream generated using a random number.

While the dummy segment SEG_DM is output, at time T7 the nonvolatile memory device 110 starts transmitting the fourth segment SEG4 to the controller 120. While the dummy segment SEG_DM is still being output at time T8, the error correction operation E_SEG2 of the second segment SEG2 is completed. The controller 120 initiates the error correction operation E_SEG3 of the third segment SEG3 at time T8.

The fourth segment SEG4 is completely transmitted to the controller 120 at time T10. In an embodiment, the external host device determines whether the dummy segment SEG_DM is transmitted incorrectly, based on the dummy data DATA_DM and the incorrect parity P2' of the dummy segment SEG_DM. At time T9, the external host device sends a retransmission request R2 to the storage device 100. Since the error correction operation of the second segment SEG2 is completed, the controller 120 retransmits the decoded second segment SEG2' to the external host device at T12, based on the retransmission request R2. Afterwards, at times T13 and T14, the controller 120 respectively sends the decoded third segment SEG3' and the decoded fourth segment SEG4' to the external host device. In an embodiment, the error correction operation E_SEG4 of the fourth segment SEG4 starts at time T11 between times T10 and T12.

As described above, when a delay section in which the storage device 100 does not output decoded data occurs, the storage device 100 sends the dummy data to the external host device, thereby preventing the external host device from receiving unintended data. The dummy data may be intended such that the external host device sends the retransmission request R2 to the storage device 100 responsive to the dummy data. Accordingly, it may be possible to achieve an improved operating speed through an early response property while maintaining the reliability of the storage device 100.

Figure 6:
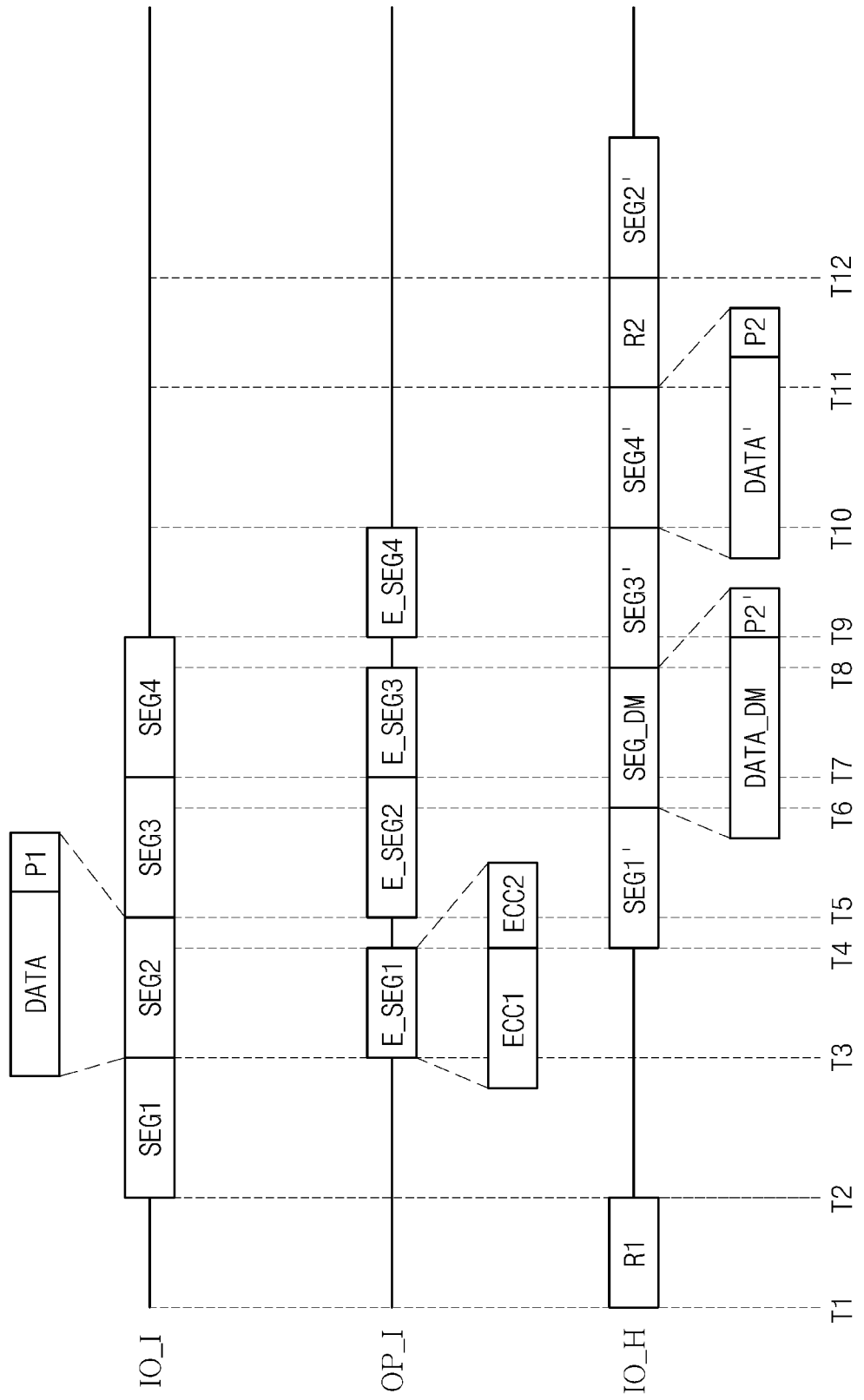
FIG. 6 illustrates a timing diagram of an example in which the storage device according to an embodiment of the inventive concept outputs data in response to a read request.

FIG. 6 illustrates a timing diagram of an example in which the storage device 100 according to an embodiment of the inventive concept outputs data in response to a read request. Operations performed from times T1 to T5 may be the same as those of FIG. 5, and a description thereof is thus omitted.

Referring to FIGS. 1, 5, and 6, at time T6, the controller 120 completes transmission of the decoded first segment SEG1' to the external host device. At time T6 when a decoded previous segment is completely transmitted, the error correction operation E_SEG2 of a current segment, that is, the second segment SEG2, is continuously performed and not yet completed. As described with reference to step S160 of FIG. 2, the controller 120 outputs a dummy segment SEG_DM that includes an incorrect parity P2' and dummy data DATA_DM to the external host device at time T6. For example, the dummy data DATA_DM may be a stream of bits having the same value, a bit stream of a predefined pattern, or a bit stream generated using a random number.

At time T7, the nonvolatile memory device 110 starts outputting the fourth segment SEG4 to the controller 120. The controller 120 completes the error correction operation E_SEG2 of the second segment SEG2 and initiates the error correction operation E_SEG3 of the third segment SEG3 at time T7.

The dummy segment SEG_DM is completely transmitted to the external host device at time T8. Because the error correction operation E_SEG3 of the third segment SEG3 is completed at time T8, the controller 120 outputs the decoded third segment SEG3' to the external host device. At time T9, the controller 120 initiates the error correction operation E_SEG4 of the fourth segment SEG4.

At time T10, the controller 120 outputs the decoded fourth segment SEG4' to the external host device. The decoded fourth segment SEG4' is completely transmitted at time T11.

When the decoded fourth segment SEG4' is received, the external host device completes receiving of data of the read unit that includes the decoded first segment SEG1', the decoded second SEG2', the decoded third segment SEG3', and the decoded fourth segment SEG4'. Afterwards, the external host device performs error correction decoding with respect to the received segments. For example, the external host device determines that the decoded second segment SEG2' must be retransmitted based on the incorrect parity P2' of the dummy segment SEG_DM. The external host device then sends the retransmission request R2 to the storage device 100 at time T11. The controller 120 outputs the decoded second segment SEG2' to the external host device at time T12 in response to the retransmission request R2.

In FIG. 5, an embodiment of the inventive concept is exemplified as the external host device checks a parity by the segment as each segment is received and requests retransmission of data from the storage device 110. However, as described with reference to FIG. 6, the external host device receives data of the read unit including all the segments, and after all the segments are received then checks parity for each segment. That is, in some embodiments the storage device 100 may be configured to receive and process the retransmission request R2 after decoded segments are completely transmitted. Furthermore, in other embodiments the storage device 100 may be configured to receive and process the retransmission request R2 after all the segments of the read unit are completely transmitted.

Figure 7:
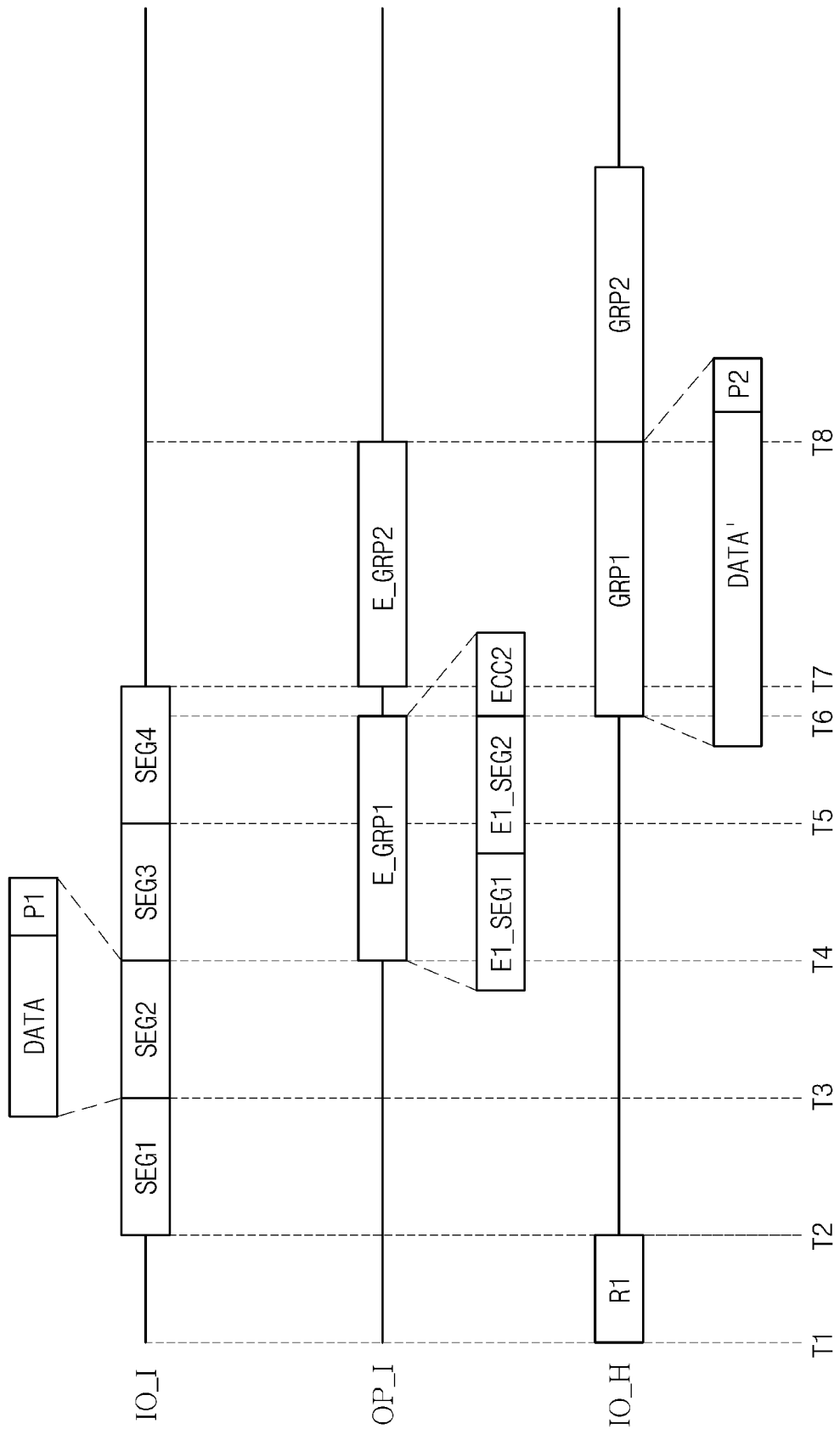
FIG. 7 illustrates a timing diagram of an example in which the storage device according to an embodiment of the inventive concept outputs data in response to a read request.

FIG. 7 illustrates a timing diagram of an example in which the storage device 100 according to an embodiment of the inventive concept outputs data in response to a read request. Referring to FIGS. 1 and 7, at time T1, the storage device 100 receives a read request R1 from the external host device. In response to the read request, the nonvolatile memory device 110 respectively outputs to the controller 120 the first to fourth segments SEG1 to SEG4 at times T2 to T5.

At time T4 when the first and second segments SEG1 and SEG2 are transmitted to the controller 120, the controller 120 performs an error correction operation E_GRP1 of a first group that includes the first and second segments SEG1 and SEG2. For example, each segment corresponds to a unit of error correction encoding and decoding of the first error correction code block ECC1 102. A group corresponds to a unit of error correction encoding and decoding of the second error correction code block ECC2 104. The error correction operation E_GRP1 of the first group includes the error correction decoding E1_SEG1 of the first segment SEG1, the error correction decoding E1_SEG2 of the second segment SEG2, and the error correction encoding of the first error correction code block ECC2 about the first and second segments SEG1 and SEG2.

When the error correction operation E_GRP1 of the first group is completed, the nonvolatile memory device 110 outputs the first group GRP1 to the external host device at time T6. The first group GRP1 includes decoded data DATA' and a second parity P2 added by second error correction code block ECC2 104.

When the third and fourth segments SEG3 and SEG4 are completely transmitted to the controller 120 at time T7, the controller 120 performs an error correction operation E_GRP2 of a second group that includes the third and fourth segments SEG3 and SEG4. When the error correction operation E_GRP2 and transmission of the decoded first group GRP1 is completed at T8, the controller 120 outputs the decoded second segment GRP2' to the external host device at time T8.

As described with reference to FIG. 7, embodiments of the inventive concept may be applied to the case that a unit of the first error correction code block ECC1 102 is different from a unit of the second error correction code block ECC2 104. For example, the controller 120 may be configured to output a dummy group when an error correction operation of a current group is not completed at a point in time when a previous group is completely transmitted.

Figure 8:
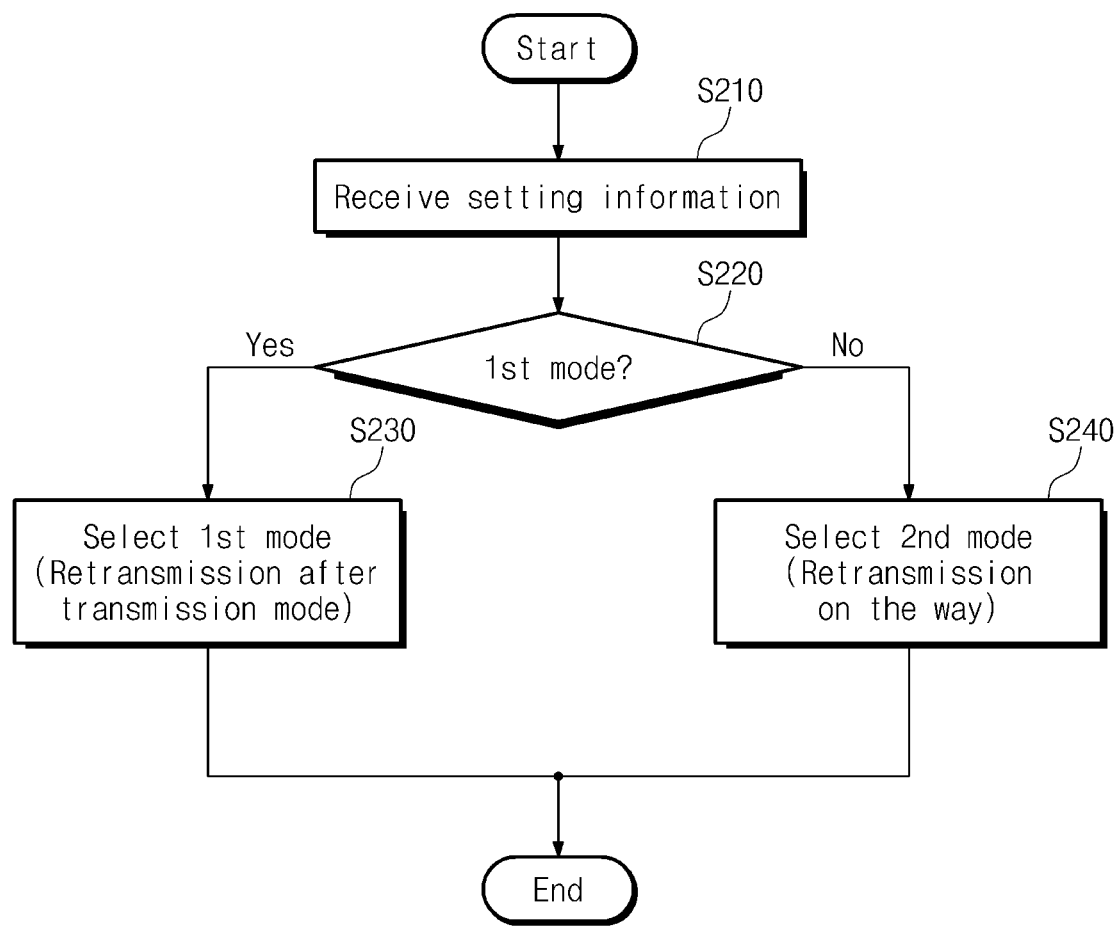
FIG. 8 illustrates a flowchart of a method in which the storage device according to an embodiment of the inventive concept sets an operating mode.

FIG. 8 illustrates a flowchart of a method in which the storage device 100 according to an embodiment of the inventive concept sets an operating mode. Referring to FIGS. 1 and 8, in step S210, the storage device 100 receives setting information from the external host device. The setting information may include information for setting an operating mode of the storage device 100.

In step S220, the storage device 100 determines whether the setting information indicates a first mode or a second mode. For example, in some embodiments the controller 120 determines whether the setting information indicates a first mode or a second mode.

If the controller 120 determines that the setting information indicates the first mode (Yes in step S220), the storage device 100 is set by the controller 120 to the first mode in step S230. For example, the first mode may be a mode of receiving a retransmission request from the external host device responsive to a parity provided by the second error correction code block ECC2 104, after data of the read unit (including all of segments SEG1'-SEG4') is completely transmitted, as described with reference to FIG. 6.

If the controller 120 determines that the setting information indicates the second mode (No in step S220), the storage device 100 is set by the controller 120 to the second mode in step S240. For example, the second mode may be a mode of receiving a retransmission request from the external host device while data of the read unit is being transmitted, as described with reference to FIG. 5. For example, the storage device 100 may be configured to receive the retransmission request R2 after each segment is completely transmitted.

In an embodiment, an operating mode of the storage device 100 may be determined or updated once after the storage device 100 is manufactured, when a power is supplied to the storage device 100, or when the setting information is sent to the storage device 100.

Figure 9:
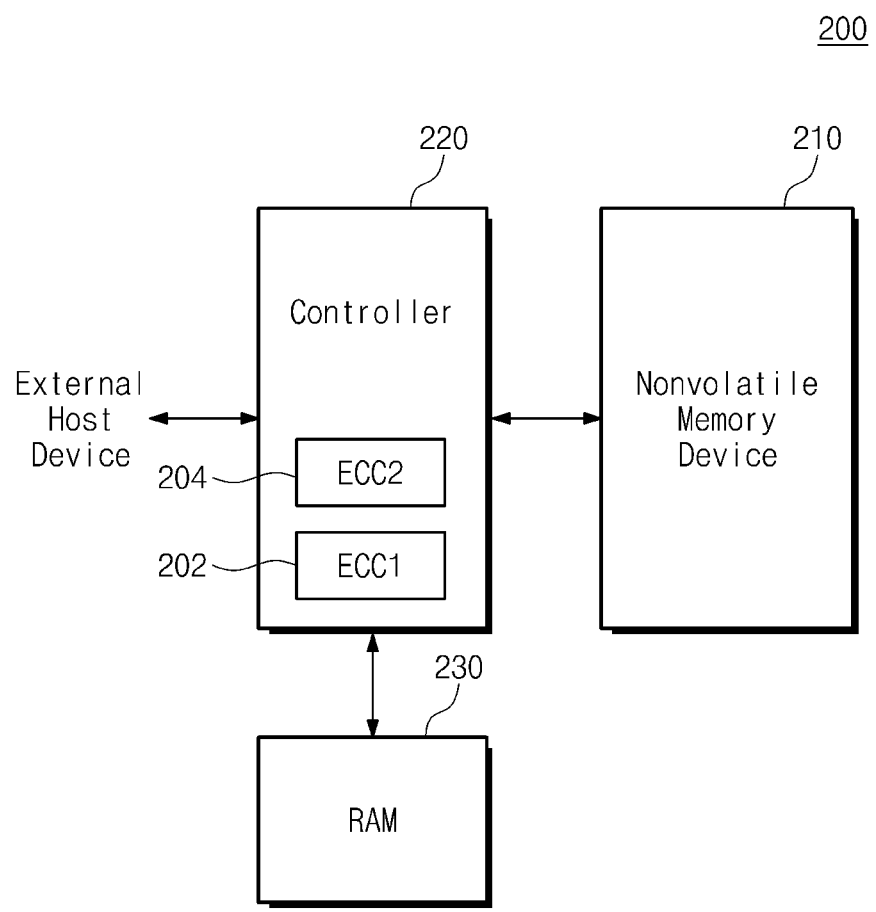
FIG. 9 illustrates a block diagram of an application of the storage device of FIG. 1.

FIG. 9 illustrates a block diagram of an application of the storage device 100 of FIG. 1. Referring to FIG. 9, a storage device 200 includes a nonvolatile memory device 210, a controller 220, and a random access memory (RAM) 230. The controller 220 includes a first error correction code block ECC1 202 and a second error correction code block ECC2 204. Compared to the storage device 100 of FIG. 1, the storage device 200 further includes the RAM 230.

The controller 220 may use the RAM 230 as a working memory, a buffer memory, or a cache memory. The controller 220 may store data or codes, needed to manage the nonvolatile memory device 210, at the RAM 230. For example, the controller 220 may read data or codes, needed to manage the nonvolatile memory device 210, from the nonvolatile memory device 210 and may load the read data or codes on the RAM 230 for driving.

The RAM 230 may include for example at least one of a variety of random access memories, such as static RAM (SRAM), dynamic RAM (DRAM), synchronous DRAM (SRAM), phase-change RAM (PRAM), magnetic RAM (MRAM), resistive RAM (RRAM), and ferroelectric RAM (FRAM), or the like.

Figure 10:
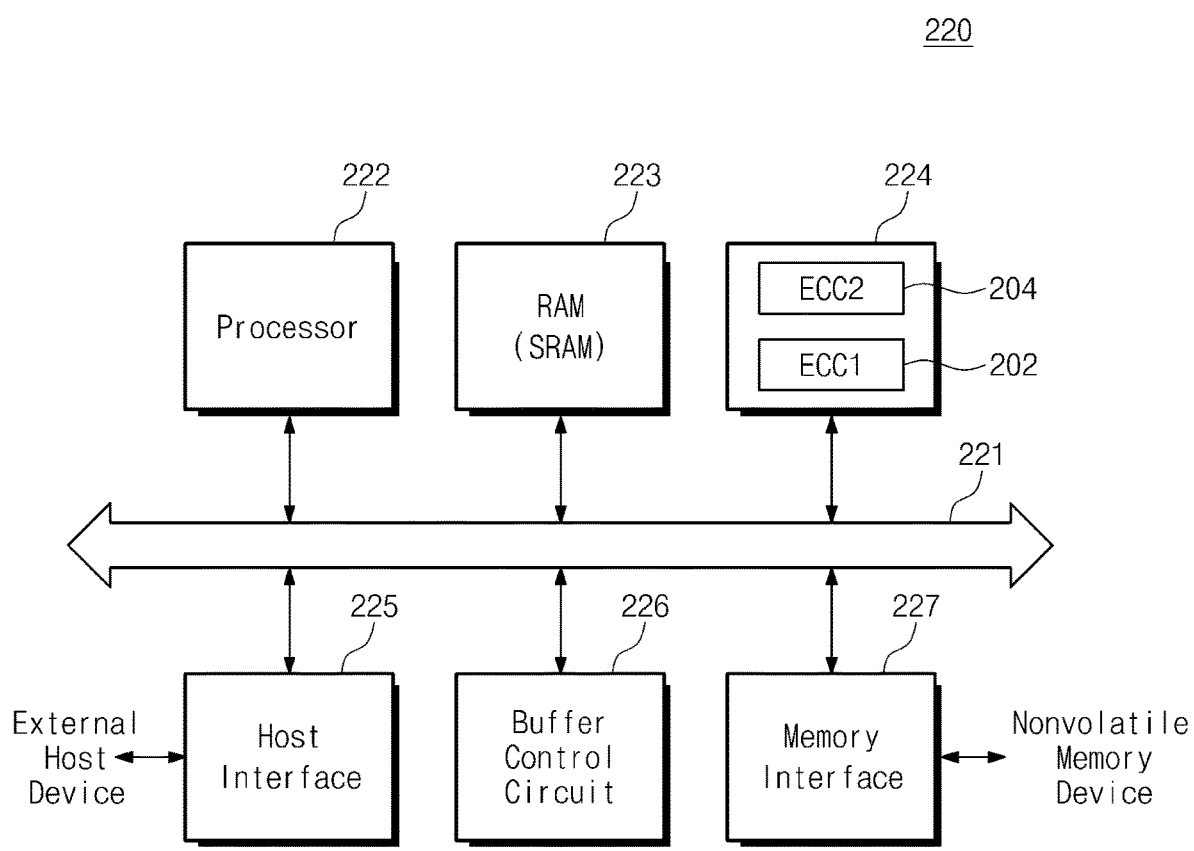
FIG. 10 illustrates a block diagram of the controller according to an embodiment of the inventive concept.

FIG. 10 illustrates a block diagram of the controller 220 according to an embodiment of the inventive concept. Referring to FIGS. 9 and 10, the controller 220 includes a bus 221, a processor 222, a RAM 223, an error correction code (ECC) block 224, a host interface 225, a buffer control circuit 226, and a memory interface 227.

The bus 221 may be configured to provide a channel among elements of the controller 220.

The processor 222 may control an overall operation of the controller 220 and may execute a logical operation. The processor 222 may communicate with the external host device through the host interface 225, may communicate with the nonvolatile memory device 210 through the memory interface 227, and may communicate with the RAM 230 through the buffer control circuit 226. The processor 222 may control the storage device 200 using the RAM 223 as a working memory, a cache memory, or a buffer memory.

The RAM 223 may be used as a working memory, a cache memory, or a buffer memory of the processor 222. The RAM 223 may store codes or commands that the processor 222 will execute. The RAM 223 may store data processed by the processor 222. The RAM 223 may for example include a static RAM (SRAM).

The error correction code block 224 may include the first error correction code block ECC1 202 and the second error correction code block ECC2 204 that are described with reference to FIGS. 1 to 8. In an embodiment, the first error correction code block ECC1 202 may be included in the memory interface 227, and the second error correction code block ECC2 204 may be included in the host interface 225.

The host interface 225 may communicate with the external host device under control of the processor 222. The host interface 225 may convey communications using at least one of various communication manners, such as for example universal serial bus (USB), serial AT attachment (SATA), serial attached SCSI (SAS), high speed interchip (HSIC), small computer system interface (SCSI), peripheral component interconnection (PCI), PCI express (PCIe), nonvolatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM), or the like.

The buffer control circuit 226 may control the RAM 230 under control of the processor 222

The memory interface 227 may communicate with the nonvolatile memory device 210 in response to control of the processor 222. The memory interface 227 may convey a command, an address, and data to the nonvolatile memory device 210 through an input/output channel. The memory interface 227 may convey a control signal to the nonvolatile memory device 210 through the control channel.

In an embodiment, in the case where the storage device 200 does not include the RAM 230, the controller 220 may not include the buffer control circuit 226.

In an embodiment, the processor 222 may control the controller 220 using codes. The processor 222 may load codes from a nonvolatile memory (e.g., a read only memory) that is implemented in the controller 220. Alternatively, the processor 222 may load codes from the nonvolatile memory device 210 through the memory interface 227.

In an embodiment, the bus 221 of the controller 220 may be divided into a control bus and a data bus. In an embodiment, the data bus may transmit data within the controller 220, and the control bus may transmit control information, such as a command and an address, within the controller 220. The data bus and the control bus may be independent of each other to prevent mutual interference or influence. The data bus may be connected with the error correction code block 224, the host interface 225, the buffer control circuit 226, and the memory interface 227. The control bus may be connected with the processor 222, the RAM 223, the host interface 225, the buffer control circuit 226, and the memory interface 227.

Figure 11:
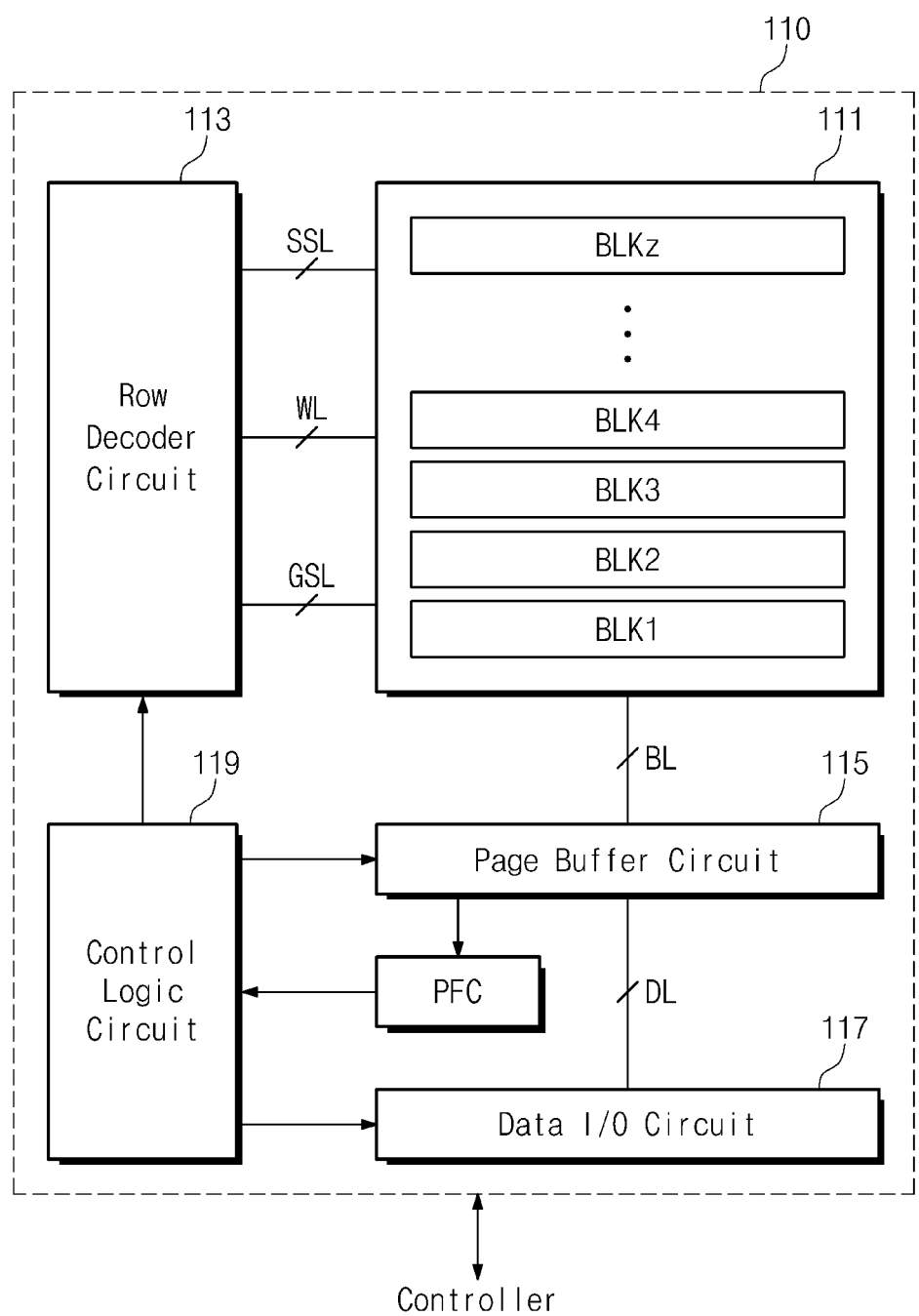
FIG. 11 illustrates a block diagram of the nonvolatile memory device according to an embodiment of the inventive concept.

FIG. 11 illustrates a block diagram of the nonvolatile memory 110 shown in FIG. 1 and the nonvolatile memory device 210 shown in FIG. 10, according to embodiments of the inventive concept.

Referring to FIGS. 1 and 11, the nonvolatile memory device 110 includes a memory cell array 111, a row decoder circuit 113, a page buffer circuit 115, a pass-fail check circuit PFC 116, a data input/output circuit 117, and a control logic circuit 119.

The memory cell array 111 may include a plurality of memory cells BLK1 to BLKz. Each of the memory blocks BLK1 to BLKz may include a plurality of memory cells. Each of the memory blocks BLK1 to BLKz may be connected to the row decoder circuit 113 through at least one string selection line SSL, a plurality of word lines WL, and at least one ground selection line GSL. Each of the memory blocks BLK1 to BLKz may be connected to the page buffer circuit 115 through a plurality of bit lines BL. The memory blocks BLK1 to BLKz may be connected in common to the plurality of bit lines BL. Memory cells in the memory blocks BLK1 to BLKz may have the same structures.

In an embodiment, each of the memory blocks BLK1 to BLKz may be a unit of an erase operation. An erase operation of memory cells in the memory cell array 111 may be carried out by the memory block. The memory cells belonging to a memory block may be erased at the same time. In another embodiment, each memory block may be divided into a plurality of sub-blocks. Each of the sub-blocks may be an erase unit.

In an embodiment, each of the memory blocks BLK1 to BLKz may include a physical storage space which is distinguished by a block address. Each of the word lines WL may correspond to a physical storage space which is distinguished by a row address. Each of the bit lines BL may correspond to a physical storage space which is distinguished by a column address.

In an embodiment, each memory block may include a plurality of physical pages, each of which includes a plurality of memory cells. A physical page may refer to a program unit. Memory cells of a physical page may be simultaneously programmed A physical page may include two or more logical pages. Bits to be programmed at memory cells of a physical page may constitute logical pages. First bits to be programmed at memory cells of a physical page may constitute a first logical page. K-th bits (K being a positive integer) to be programmed at the memory cells of the physical page may constitute a k-th logical page.

The row decoder circuit 113 may be connected to the memory cell array 111 through a plurality of ground selection lines GSL, the plurality of word lines WL, and a plurality of string selection lines SSL. The row decoder circuit 113 may operate according to control of the control logic circuit 119. The row decoder circuit 113 may decode an address received from the controller 120 through an input/output channel and may allow voltages to be applied to the string selection lines SSL, the word lines WL, and the ground selection lines GSL based on the decoded address.

For example, during a program operation, the row decoder circuit 113 may apply a program voltage to a selected word line in a memory block selected by an address and a pass voltage to unselected word lines in the selected memory block. During a read operation, the row decoder circuit 113 may apply a selection read voltage to a selected word line in a memory block selected by an address and a non-selection read voltage to unselected word lines in the selected memory block. During an erase operation, the row decoder circuit 113 may apply an erase voltage (e.g., a ground voltage or a low voltage of which the level is similar to that of the ground voltage) to word lines in a memory block selected by an address.

The page buffer circuit 115 may be connected to the memory cell array 111 through the bit lines BL. The page buffer circuit 115 may be connected to the data input output circuit 117 through a plurality of data lines DL. The page buffer circuit 115 may operate under control of the control logic circuit 119.

During a program operation, the page buffer circuit 115 may store data to be programmed in memory cells. The page buffer circuit 115 may apply voltages to the bit lines BL based on the stored data. For example, the page buffer circuit 115 may function as a write driver. During a read operation or a verification read, the page buffer circuit 115 may sense voltages on the bit lines BL and may store the sensed results therein. For example, the page buffer circuit 115 may function as a sense amplifier.

After a verification read operation, the pass-fail check circuit PFC 116 may receive the sensed results from the page buffer circuit 115. The pass-fail check circuit PFC 116 may determine a pass or fail based on the received sensed results. For example, during a program verification read operation, the page buffer circuit 115 may count the number of on-cells. When the number of on-cells is greater than or equal to a threshold value, the pass-fail check circuit PFC 116 may determine verification fail. When the number of on-cells is smaller than the threshold value, the pass-fail check circuit PFC 116 may determine verification pass. For example, during an erase verification read operation, the page buffer circuit 115 may count the number of off-cells. When the number of off-cells is greater than or equal to a threshold value, the pass-fail check circuit PFC 116 may determine erase verification fail. When the number of on-cells is smaller than the threshold value, the pass-fail check circuit PFC 116 may determine erase verification pass. The pass or fail determination result may be provided to the control logic circuit 119.

The data input/output circuit 117 may be connected to the page buffer circuit 115 through the data lines DL. The data input/output circuit 117 may output data, which is read by the page buffer circuit 115, to the controller 120 through the input/output channel and may provide data, which is received from the controller 120 through the input/output channel, to the page buffer circuit 115.

The control logic circuit 119 may receive a command from the controller 120 through the input/output channel and may receive a control signal there from through a control channel. The control logic circuit 119 may receive a command, which is provided through the input/output channel, in response to the control signal, may route an address, which is provided through the input/output channel, to the row decoder circuit 113, and may route data, which is provided through the input/output channel, to the data input/output circuit 117. The control logic circuit 119 may decode the received command and may control the nonvolatile memory device 110 based on the decoded command.

In an embodiment, the control logic circuit 119 may generate a data strobe signal DQS based on a read enable signal /RE received from the controller 120 through the input/output channel. The data strobe signal DQS thus generated may be outputted to the controller 120 through the control channel During a program operation, the control logic circuit 119 may receive the data strobe signal DQS from the controller 120 through the control channel.

Under control of the control logic circuit 119, a program operation, an erase operation, and a read operation may be performed with respect to memory cells of each memory block. The program operation may include a plurality of program loops. A program loop may be repeated until the program operation is determined as being pass.

Each program loop may include a program and a verification. In the program, the page buffer circuit 115 may apply voltages to bit lines BL based on data to be programmed. For example, a ground voltage or a low voltage of which the level is similar to that of the ground voltage may be applied to a bit line corresponding to a memory cell of which the threshold voltage is to be increased, and a power supply voltage or a positive voltage of which the level is similar to that of the power supply voltage may be applied to a memory cell (e.g., a memory cell to be program inhibited) of which the threshold voltage does not need to increase. The row decoder circuit 113 may apply a program voltage to a word line connected to selected memory cells and may apply a pass voltage to the remaining word lines. In the verification, a result of the program operation performed in the program may be verified. The verification may include a verification read and a pass-fail determination. During the verification read, the page buffer circuit 115 may apply a power supply voltage or a positive voltage of which the level is similar to that of the power supply voltage, to the bit lines BL or bit lines corresponding to memory cells to be verified. The row decoder circuit 113 may apply a verification voltage to a word line connected to the memory cells to be verified and may apply read pass voltages to the remaining word lines, respectively. The result of the verification read may be sensed by the page buffer circuit 115, and the sensed result may be provided to the pass-fail check circuit PFC 116. During the pass-fail determination operation, pass-fail check circuit PFC 116 may determine pass or fail based on the result of the verification read.

In an embodiment, during a program operation of the nonvolatile memory device 110, the nonvolatile memory device 110 may continuously receive all bits to be programmed at memory cells of a selected physical page of the memory cell array 111 and may complete programming of the selected physical page through a program operation based on the continuously received bits. That the programming is completed may mean that all bits to be programmed at a corresponding physical page are programmed to have a readable state and additional programming of the corresponding physical page is prohibited.

A read operation may be similar to a verification read. During the read operation, the page buffer circuit 115 may apply a power supply voltage or a positive voltage of which the level is similar to that of the power supply voltage, to the bit lines BL or bit lines corresponding to memory cells to be read. The row decoder circuit 113 may apply a read voltage to a word line connected to memory cells to be read and may apply read pass voltages to the remaining word lines. The result of the read operation may be sensed by the page buffer circuit 115 and may be outputted through the data input/output circuit 117.

An erase operation may include a plurality of erase loops. The erase loop may be repeated until the erase operation is passed. Each erase loop may include an erase and a verification. During the erase, the row decoder circuit 113 may apply a ground voltage or a low voltage of which the level is similar to that of the ground voltage, to word lines connected to selected memory cells. An erase voltage may be applied to channels of the selected memory cells through a substrate. During the verification, the result of the erase operation performed in the erase result may be verified. The verification may include a verification read and a pass-fail determination. During the verification read, the page buffer circuit 115 may apply a power supply voltage or a positive voltage of which the level is similar to that of the power supply voltage, to the bit lines BL or bit lines corresponding to memory cells to be erase verified. The row decoder circuit 113 may apply an erase verification voltage to word lines connected to memory cells to be erase verified. The result of the verification read may be sensed by the page buffer circuit 115, and the sensed result may be provided to the pass-fail check circuit PFC 116. During the pass-fail determination operation, pass-fail check circuit PFC 116 may determine whether or not of pass or fail based on the result of the verification read.

FIG. 12 illustrates a circuit diagram of a memory block BLKa according to an embodiment of the inventive concept. Referring to FIG. 12, a memory block BLKa includes a plurality of cell strings CS11 to CS21 and CS12 to CS22. The plurality of cell strings CS11 to CS21 and CS12 to CS22 may be arranged along a row direction and a column direction to constitute rows and columns.

For example, the cell strings CS11 and CS12 arranged along the row direction may constitute a first row, and the cell strings CS21 and CS22 arranged along the row direction may constitute a second row. The cell strings CS11 and CS21 arranged along the column direction may constitute a first column, and the cell strings CS12 and CS22 arranged along the column direction may constitute a second column.

Each cell string may contain a plurality of cell transistors. The cell transistors may include ground selection transistors GST, memory cells MC1 to MC6, and string selection transistors SSTa and SSTb. The ground selection transistor GST, memory cells MC1 to MC6, and string selection transistors SSTa and SSTb in each cell string may be stacked in a height direction perpendicular to a plane (e.g., a plane on a substrate of the memory block BLKa) on which the cell strings CS11 to CS21 and CS12 to CS22 are arranged along the rows and the columns.

A plurality of cell transistors of memory cells MC1 to MC6, string selection transistors SSTa and SSTb, and ground selection transistor GST may be charge trap type cell transistors of which the threshold voltage changes according to the amount of charges trapped in an insulating layer thereof.

Sources of the lowermost ground selection transistors GST may be connected in common to a common source line CSL.

Control gates of ground selection transistors GST of the cell strings CS11 and CS12 in a first row may be connected in common to a ground selection line GSL1, and control gates of ground selection transistors GST of the cell strings CS21 and CS22 in a second row may be connected in common to a ground selection line GSL2. That is, cell strings in different rows may be connected to different ground selection lines.

In an embodiment, the memory block BLKa may be modified or changed such that more than one ground selection transistor GST is including in each cell string, and ground selection lines which are connected to ground selection transistors belonging to the same row and placed at different heights are connected to different ground selection lines. In an embodiment, the memory block BLKa may be modified or changed such that ground selection lines which are connected to ground selection transistors belonging to different rows and placed at the same height are interconnected and controlled in common. In an embodiment, the memory block BLKa may be modified or changed such that ground selection lines which are connected to ground selection transistors are interconnected and controlled in common.

Connected in common to a word line are control gates of memory cells that are placed at the same height (or order) from the substrate (or the ground selection transistors GST). Connected to different word lines WL1 to WL6 are control gates of memory cells that are placed at different heights (or, orders). For example, memory cells MC1 may be connected in common to a word line WL1. Memory cells MC2 may be connected in common to a word line WL2. Memory cells MC3 may be connected in common to a word line WL3. Memory cells MC4 may be connected in common to a word line WL4. Memory cells MC5 may be connected in common to a word line WL5. Memory cells MC6 may be connected in common to a word line WL6.

Of the first string selection transistors SSTa of the cell strings CS11 to CS21 and CS12 to CS22 which have the same height (or order), control gates of the first string selection transistors SSTa in different rows may be connected to different string selection lines SSL1a and SSL2a. For example, the first string selection transistors SSTa of the cell strings CS11 and CS12 may be connected in common to the string selection line SSL1a. The first string selection transistors SSTa of the cell strings CS21 and CS22 may be connected in common to the string selection line SSL2a.

Of the second string selection transistors SSTb of the cell strings CS11 to CS21 and CS12 to CS22 which have the same height (or order), control gates of the second string selection transistors SSTb in different rows may be connected to different string selection lines SSL1b and SSL2b. For example, the second string selection transistors SSTb of the cell strings CS11 and CS12 may be connected in common to the string selection line SSL1b. The second string selection transistors SSTb of the cell strings CS21 and CS22 may be connected in common to the string selection line SSL2b.

That is, cell strings in different rows may be connected to different string selection lines. String selection transistors, having the same height (or, order), of cell strings in the same row may be connected to the same string selection line. String selection transistors, having different heights (or, orders), of cell strings in the same row may be connected to different string selection lines.

In an embodiment, string selection transistors of cell strings in the same row may be connected in common to a string selection line. For example, the string selection transistors SSTa and SSTb of the cell strings CS11 and CS12 in a first row may be connected in common to a string selection line. The string selection transistors SSTa and SSTb of the cell strings CS21 and CS22 in a second row may be connected in common to a string selection line.

Columns of the cell strings CS11 to CS21 and CS12 to CS22 may be connected to different bit lines BL1 and BL2. For example, the string selection transistors SSTb of the cell strings CS11 and CS21 in the first column may be connected in common to the bit line BL1. The string selection transistors SSTb of the cell strings CS12 and CS22 may be connected in common to the bit line BL2.

The memory block BLKa may be characterized in that memory cells placed at the same height from the substrate share a word line. The memory block BLKa may be also characterized in that different memory blocks do not share word lines. For example, a memory cell of a first memory block placed at a first height may share a word line with another memory cell of the first memory block placed at the first height. The memory cell of the first memory block placed at the first height may not share a word line with a memory cell of a second memory block placed at the first height. A sub-block may be a portion of the memory block BLKa.

The cell strings CS11 and CS12 may constitute a first plane. The cell strings CS21 and CS22 may constitute a second plane.

In the memory block BLKa, memory cells of each plane placed at the same height may compose a physical page. A physical page may be a unit of writing and reading the memory cells MC1 to MC6. For example, one plane of the memory block BLKa may be selected by the string selection lines SSL1a, SSL1b, SSL2a, and SSL2b. The cell strings CS11 and CS12 in a first plane may be connected to the bit lines BL1 and BL2 when a turn-on voltage is supplied to the string selection lines SSL1a and SSL1b and a turn-off voltage is supplied to the string selection lines SSL2a and SSL2b. That is, the first plane may be selected. The cell strings CS21 and CS22 in a second plane may be connected to the bit lines BL1 and BL2 when the turn-on voltage is supplied to the string selection lines SSL2a and SSL2b and the turn-off voltage is supplied to the string selection lines SSL1a and SSL1b. That is, the second plane may be selected. In a selected plane, a row of memory cells MC may be selected by the word lines WL1 to WL6. In the selected row, a selection voltage may for example be applied to the second word line WL2, and a non-selection voltage may be respectively applied to the remaining word lines WL1 and WL3 to WL6. That is, a physical page which corresponds to the second word line WL2 of the second plane may be selected by adjusting voltages of the string selection lines SSL1a, SSL1b, SSL2a, and SSL2b and the word lines WL1 to WL6. A write or read operation may be performed with respect to memory cells MC2 in the selected physical page.

For example, two or more bits may be written at each memory cell MC. Bits which are written at memory cells belonging to one physical page may form logical pages. First bits which are written at memory cells belonging to one physical page may form a first logical page. N-th bits which are written at memory cells belonging to one physical page may form an N-th logical page. A logical page may refer to a data access unit. Data may be accessed by the logical page when a read operation is performed with respect to one physical page.

In the memory block BLKa, the memory cells MC1 to MC6 may be erased by the memory block or by the sub-block. When erasing is performed by the memory block, all memory cells MC in the memory block BLKa may be simultaneously erased according to an erase request (e.g., an erase request from an external controller). When erasing is performed by the sub-block, a portion of memory cells MC in the memory block BLKa may be simultaneously erased according to an erase request (e.g., an erase request from an external controller), and the other portion of memory cells MC in the memory block BLKa thereof may be erase-inhibited. A low voltage (e.g., a ground voltage or a low voltage of which the level is similar to that of the ground voltage) may be supplied to a word line connected to memory cells MC to be erased, and a word line connected to erase-inhibited memory cells MC may be floated.

The memory block BLKa shown in FIG. 12 is only exemplary. In other embodiments for example, the number of rows of cell strings may increase or decrease. As the number of rows of cell strings is changed, the number of string or ground selection lines and the number of cell strings connected to a bit line may be also changed.

For example, the number of columns of cell strings may increase or decrease. As the number of columns of cell strings is changed, the number of bit lines connected to columns of cell strings and the number of cell strings connected to a string selection line may be also changed.

A height of the cell strings may increase or decrease. For example, the number of ground selection transistors, memory cells, or string selection transistors that are stacked in each cell string may increase or decrease.

In an embodiment, memory cells MC in a physical page may correspond to at least three logical pages. For example, k bits (k being an integer of 2 or more) may be programmed in a memory cell MC. Memory cells MC of a physical page may store k logical pages each of which is composed of n-th bits programmed at memory cells MC respectively.

As described above, the memory block BLKa may be provided as a three-dimensional memory array. The 3D memory array is monolithically formed in one or more physical levels of arrays of memory cells MC having an active area disposed above a silicon substrate and a circuitry associated with the operation of those memory cells MC. The circuit associated with an operation of memory cells MC may be located above or within such substrate. The term "monolithic" means that layers of each level of the array are directly deposited on the layers of each underlying level of the 3D memory array.

In an embodiment of the inventive concept, the 3D memory array includes vertical NAND strings (or cell strings) that are vertically oriented such that at least one memory cell is located over another memory cell. The at least one memory cell MC may comprise a charge trap layer. Each vertical NAND string may further include at least one selection transistor placed over the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 13:
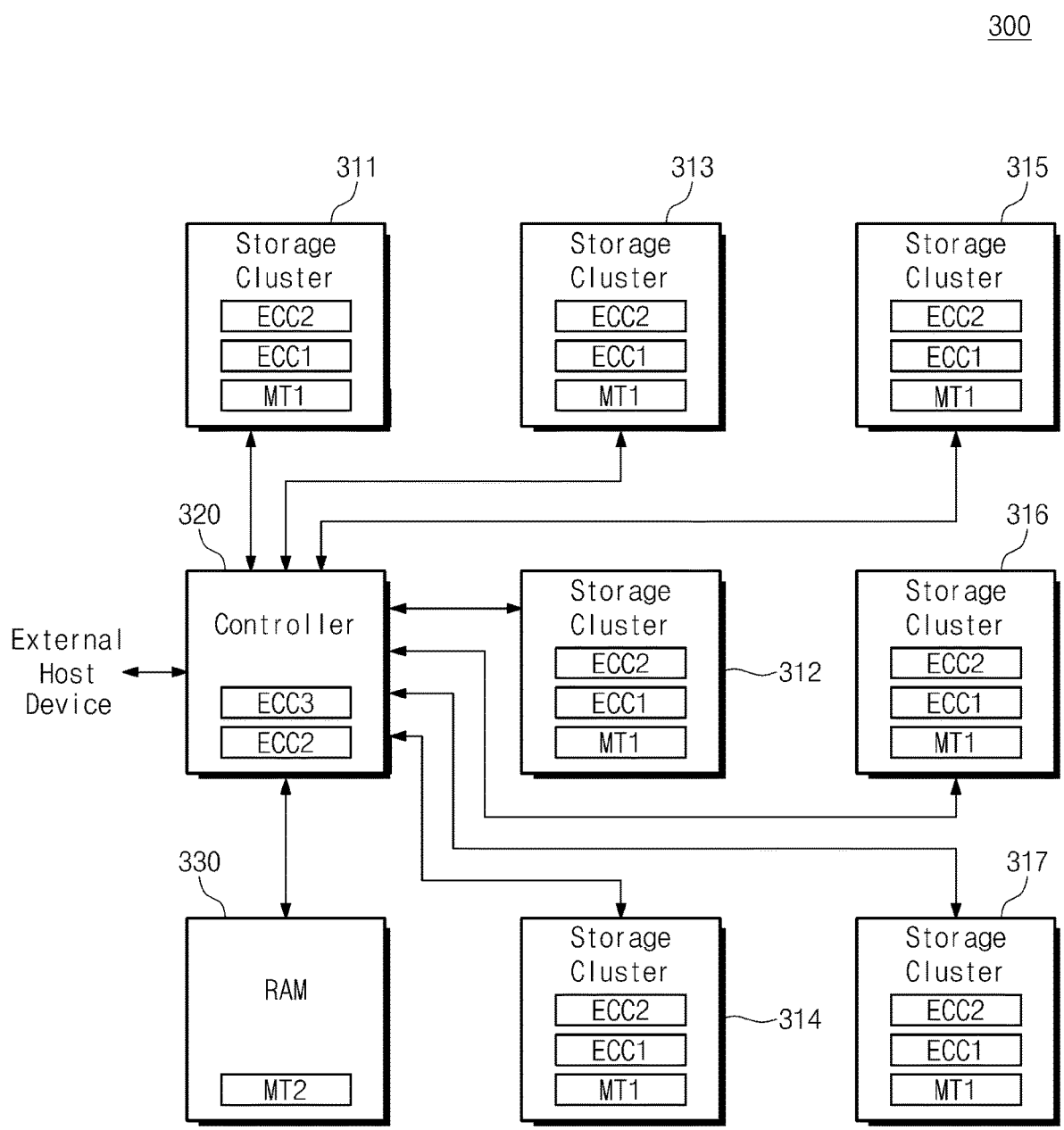
FIG. 13 illustrates a block diagram of a storage device according to an embodiment of the inventive concept.

FIG. 13 illustrates a block diagram of a storage device 300 according to an embodiment of the inventive concept. Referring to FIGS. 1, 9, and 13, the storage device 300 includes storage clusters 311 to 317, a mass controller 320, and a random access memory (RAM) 330.

Each of the storage clusters 311 to 317 may perform writing, reading and erasing under control of the mass controller 320. Each of the storage clusters 311 to 317 may receive a command and an address from the mass controller 320 through an input/output channel. Each of the storage clusters 311 to 317 may exchange data with the mass controller 320 through the input/output channel Each of the storage clusters 311 to 317 may include the storage device 100 that is described with reference to FIG. 1 or the storage device 200 that is described with reference to FIG. 9.

Each of the storage clusters 311 to 317 may exchange a control signal with the mass controller 320 through a control channel. For example, each of the storage clusters 311 to 317 may receive a chip enable signal (/CE), a command latch enable signal (CLE), an address latch enable signal (ALE), a read enable signal (/RE), a write enable signal (/WE), a write protect signal (/WP), a ready/busy signal (RnB), and a data strobe signal DQS from the mass controller 320. In each of the storage clusters 311 to 317, the chip enable signal (/CE), the command latch enable signal (CLE), the address latch enable signal (ALE), the read enable signal (/RE), the write enable signal (/WE), the write protect signal (/WP), and the data strobe signal DQS may be transmitted directly to the nonvolatile memory device 110 or 120 or through the controller 120 or 220 thereto. For example, each of the storage clusters 311 to 317 may output the ready/busy signal R/nB and the data strobe signal DQS to the mass controller 320. The ready/busy signal R/nB and the data strobe signal DQS may be transmitted directly to the controller 320 or through the controller 120 or 220 thereto.

Each of the storage clusters 311 to 317 may include the first error correction code block ECC1 (such as first error correction code blocks ECC1 102 or 202), the second error correction code block ECC2 (such as second error correction code blocks ECC2 104 or 204), and a first mapping table MT1. On the basis of the first error correction code block ECC1, each of the storage clusters 311 to 317 may perform error correction encoding with respect to data to be written at the nonvolatile memory device 110 or 120 and may perform error correction decoding with respect to data read from the nonvolatile memory device 110 or 120. For example, the first error correction code block ECC1 may perform error correction encoding and decoding based on at least one of various error management algorithms such as BCH code, RS code, hamming code, turbo code, and LDPC code, or the like.

On the basis of the second error correction code block ECC2, each of the storage clusters 311 to 317 may perform error correction encoding with respect to data to be transmitted to the mass controller 320 and may perform error correction decoding with respect to data received from the mass controller 320. For example, the second error correction code block ECC2 may perform error correction encoding and decoding based on a CRC code or the like.

Each of the storage clusters 311 to 317 may perform address mapping based on the first mapping table MT1. For example, each of the storage clusters 311 to 317 may convert an address received from the mass controller 320, for example, a logical address LBA to a physical address PBA using the first mapping table MT1. The physical address PBA may be an address allocated to an internal physical storage space of each of the storage clusters 311 to 317. Each of the storage clusters 311 to 317 may access a storage space, which the physical address indicates, in response to a request of the mass controller 320. For example, the first mapping table MT1 may be loaded on an internal memory of the controller 120 or the external RAM 230 of the controller 220.

In an embodiment, seven storage clusters 311 to 317 are illustrated in FIG. 13. However, the number of storage clusters that the storage device 300 includes may not be limited thereto. That is, more or less storage clusters may be provided as connected to the mass controller.

The mass controller 320 may be configured to control the storage clusters 311 to 317. For example, the mass controller 320 may control the storage clusters 311 to 317 through the input/output channel and the control channel so as to perform a write, read or erase operation.

The mass controller 320 may be configured to communicate with the external host device. The mass controller 320 may control the storage clusters 311 to 317 in response to control of the external host device. For example, the mass controller 320 may communicate with the external host device based on the format different from the format for communications with the storage clusters 311 to 317. A unit of data which the mass controller 320 communicates with the storage clusters 311 to 317 may be different from a unit of data which the mass controller 320 communicates with the external host device.

The mass controller 320 may use the RAM 330 as a working memory, a buffer memory, or a cache memory. The mass controller 320 may store data or codes for management of the storage clusters 311 to 317, at the RAM 330. For example, the mass controller 320 may read data or codes for management of the storage clusters 311 to 317, from the storage clusters 311 to 317 and may load the read data or codes on the RAM 330 for driving.

For example, the mass controller 320 may load a second mapping table MT2 on the RAM 330. The mass controller 320 may select one of the storage clusters 311 to 317 based on the second mapping table MT2 and an address received from the external host device, for example, a logical address LBA. For example, a logical address range of the storage device 300 may be allocated by the external host device. The mass controller 320 may divide the allocated logical address range so as to be allocated to the storage clusters 311 to 317, respectively. Information about division and allocation of logical addresses may be included in the second mapping table MT2. When receiving a logical address LBA and an access request from the external host device, the mass controller 320 may select an access target of the storage clusters 311 to 317 based on the second mapping table MT2.

The mass controller 320 may include the second error correction code block ECC2 and a third error correction code block ECC3. The mass controller 320 may perform error correction encoding with respect to data to be sent to the storage clusters 311 to 317 using the second error correction code block ECC2. The mass controller 320 may perform error correction decoding with respect to data received from the storage clusters 311 to 317 using the second error correction code block ECC2. The second error correction code block ECC2 may perform error correction encoding and decoding based for example on the CRC code.

The mass controller 320 may perform error correction encoding with respect to data, which is exchanged with the external host device, using the third error correction code block ECC3. For example, the mass controller 320 may perform error correction decoding with respect to data, which is received from the external host device, using the third error correction code block ECC3. The mass controller 320 may perform error correction encoding with respect to data, which is to be transmitted to the external host device, using the third error correction code block ECC3. For example, the third error correction code block ECC3 may perform error correction encoding and decoding based on the CRC code.

The RAM 330 may include at least one of a variety of random access memories, such as for example static RAM (SRAM), dynamic RAM (DRAM), synchronous DRAM (SRAM), phase-change RAM (PRAM), magnetic RAM (MRAM), resistive RAM (RRAM), and ferroelectric RAM (FRAM), or the like.

In an embodiment, the mass controller 320 and the storage clusters 311 to 317 may be interconnected based on a channel and a way. One channel may include one data channel and one control channel. One data channel may include eight data lines. One control channel may include control lines for transmitting the chip enable signal (/CE), the command latch enable signal (CLE), the address latch enable signal (ALE), the read enable signal (/RE), the write enable signal (/WE), the write protect signal (/WP), and the ready/busy signal (R/nB).

Storage clusters connected to one channel may constitute a way. N storage clusters that are connected to one channel may constitute an n-way. Storage clusters that belong to one way may share data lines and the control lines for transmitting the command latch enable signal CLE, the address latch enable signal ALE, the read enable signal /RE, the write enable signal /WE, and the write protect signal /WP. Each of storage clusters belonging to one way may communicate with the mass controller 320 through control lines dedicated to the chip enable signal /CE and the ready/busy signal R/nB.

In an embodiment, each of the storage clusters 311 to 317 may operate according to a method described with reference to FIGS. 2 to 8. For example, when error correction decoding of one segment is completed, the controller 120 or 220 of each of the storage clusters 311 to 317 may output the segment to the mass controller 320. When error correction decoding of a current segment is not completed by the time a threshold time has elapsed after a previous segment is output, the controller 120 or 220 may output a dummy segment, which includes an incorrect parity, to the mass controller 320. When an incorrect parity is received or when at least one of received segments of the read unit includes an incorrect parity, the mass controller 320 may send a retransmission request to a corresponding storage cluster.

The mass controller 320 may alternately access n-way storage clusters connected to one channel. The mass controller 320 may independently access storage clusters connected with different channels. The mass controller 320 may alternately or simultaneously access storage clusters connected with different channels.

In an embodiment, storage clusters may be connected with the mass controller 320 in the form of a wide IO. For example, storage clusters connected to different channels may share a control line for the chip enable signal /CE. Storage clusters which share the control line for the chip enable signal /CE may be accessed at the same time. Because data lines of different channels are used at the same time, a wide input/output bandwidth may be achieved.

The storage device 300 may include a storage module, a solid state drive (SSD), or a hard disk drive (HDD). The storage device 300 may include memory cards, such as for example PC cards (personal computer memory card international association (PCMCIA)), compact flash (CF) cards, smart media cards (e.g., SM, SMC), memory sticks, multimedia cards (e.g., MMC, RS-MMC, MMCmicro), SD cards (e.g., SD, miniSD, microSD, SDHC), universal serial bus (USB) memory cards, and universal flash storages (UFS), or the like. The storage device 300 may include embedded memories, such as for example embedded MultiMedia cards (eMMC), UFSs, and PPNs (Perfect Page NAND), or the like.

In FIG. 13, an embodiment of the inventive concept is exemplified as the storage device 300 includes the RAM 330 disposed outside the controller 320. However, in other embodiments the storage device 300 may not include the RAM 330 disposed outside the controller 320. The mass controller 320 may use an internal RAM as a buffer memory, a working memory, or a cache memory.

Figure 14:
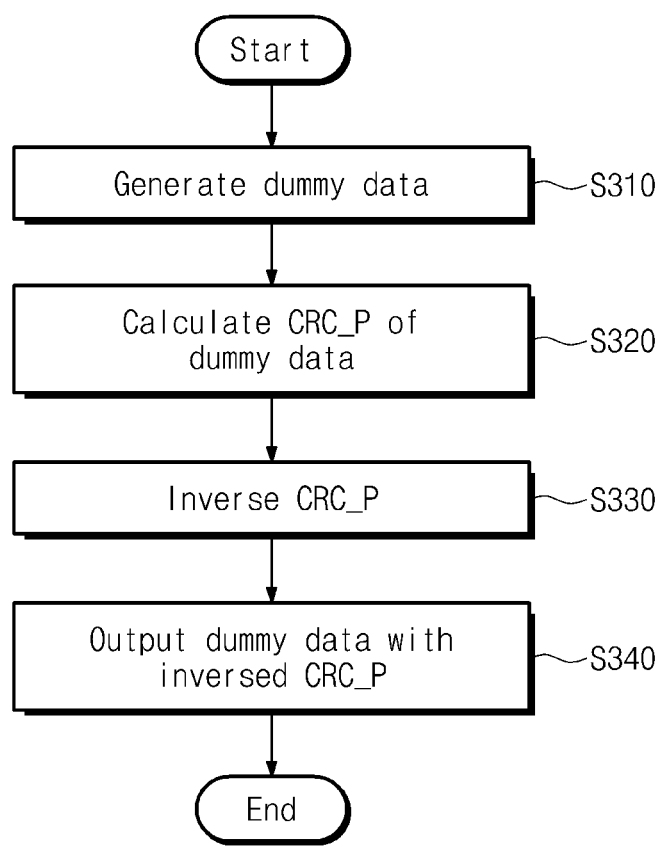
FIG. 14 illustrates a flowchart of a method of generating an incorrect parity, according to an embodiment of the inventive concept.

FIG. 14 illustrates a flowchart of a method of generating an incorrect parity, according to an embodiment of the inventive concept. Referring to FIGS. 1, 9, and 14, in step S310, the controller 120 or 220 generates dummy data. For example, the dummy data may include at least one of a bit stream of a predefined pattern, a bit stream of a fixed value, a bit stream of a pattern, and a bit stream of a previous segment.

In step S320, the controller 120 or 220 calculates a CRC parity CRC_P of the dummy data. For example, the second error correction code block ECC2 104 (204) may perform CRC code based error correction encoding with respect to the dummy data to generate a CRC parity CRC_P.

In step S330, the controller 120 or 220 inverts the CRC parity CRC_P.

In step S340, the controller 120 or 220 outputs the inverted CRC parity CRC_P as the second parity P2 together with the dummy data.

In the above-described embodiments, the second error correction code block ECC2 104 (204) is described as being based on the CRC code. However, in other embodiments the second error correction code block ECC2 104 (204) may perform error correction encoding and decoding based on at least one of various error management algorithms such as for example BCH code, RS code, hamming code, turbo code, LDPC code, and polar code, or the like.

Figure 15:
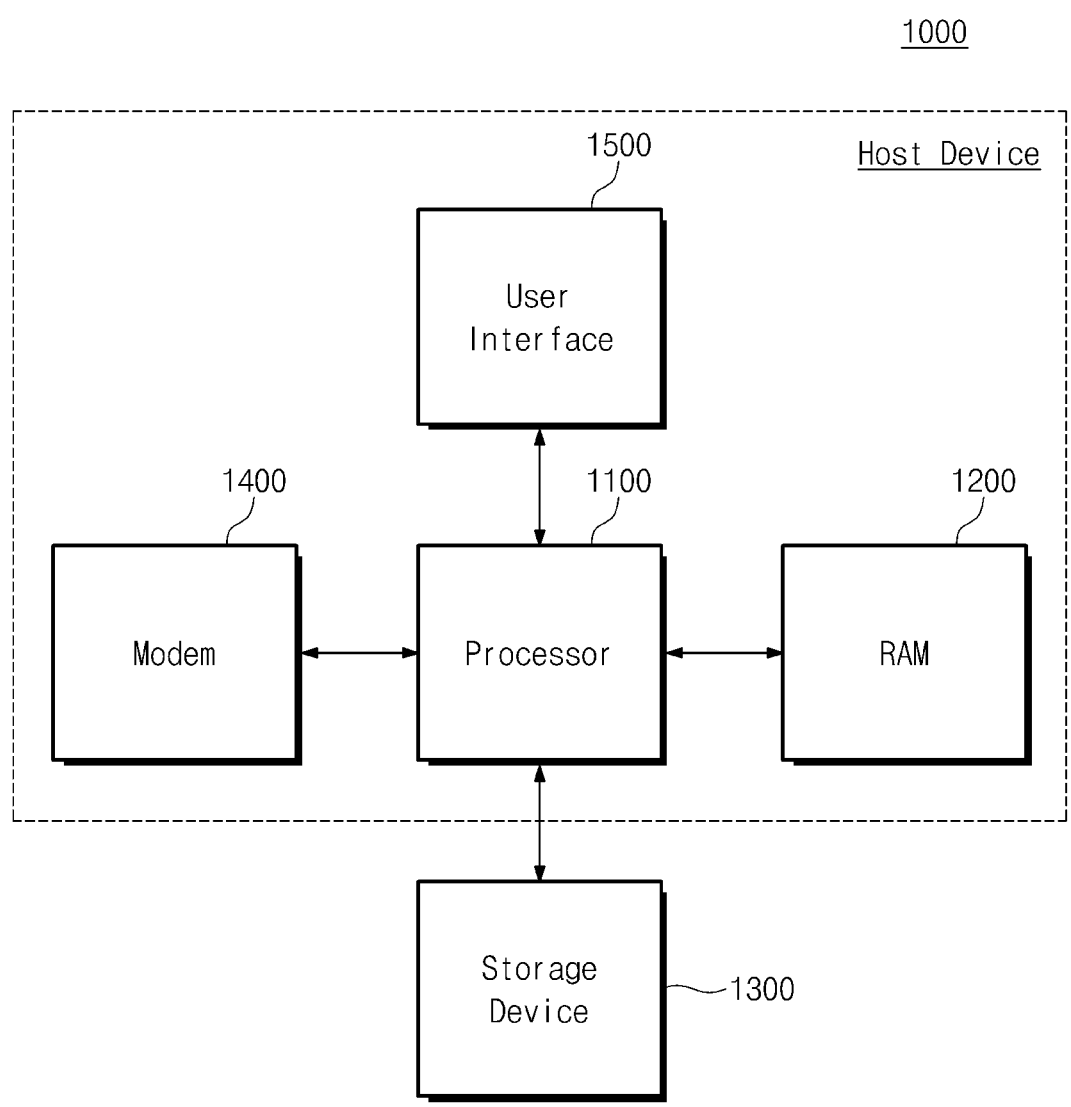
FIG. 15 illustrates a block diagram of a computing device according to an embodiment of the inventive concept.

FIG. 15 illustrates a block diagram of a computing device 1000 according to an embodiment of the inventive concept. Referring to FIG. 15, a computing device 1000 includes a processor 1100, a RAM 1200, a storage device 1300, a modem 1400, and a user interface 1500.

The processor 1100 may control an overall operation of the computing device 1000 and may perform a logical operation. The processor 1100 may be a hardware-based data processing device which includes a circuit physically configured to execute operations expressed by commands included in a code or program. For example, the processor 1100 may be a system-on-chip (SoC). The processor 1100 may be a general purpose processor, a specific-purpose processor, or an application processor.

The RAM 1200 may communicate with the processor 1100. The RAM 1200 may be a main memory of the processor 1100 or the computing device 1000. The processor 1100 may store codes or data at the RAM 1200 temporarily. The processor 1100 may execute codes using the RAM 1200 and may process data. The processor 1100 may execute a variety of software, such as an operating system and an application, using the RAM 1200. The processor 1100 may control an overall operation of the computing device 1000 using the RAM 1200. The RAM 1200 may include volatile memory such as for example SRAM, DRAM, and/or SDRAM or the like, or nonvolatile memory such as for example PRAM, MRAM, RRAM, and/or FRAM or the like.

The storage device 1300 may communicate with the processor 1100. The storage device 1300 may be used to store data for a long time. That is, the processor 1100 may store data, which is to be stored for a long time, at the storage device 1300. The storage device 1300 may store a boot image for driving the computing device 1000. The storage device 1300 may store source codes of a variety of software, such as an operating system and an application. The storage device 1300 may store data that is processed by a variety of software, such as an operating system and an application.

In an embodiment, the processor 1100 may load source codes stored at the storage device 1300 on the RAM 1200 and may execute the codes, thereby driving a variety of software, such as an operating system and an application. The processor 1100 may load data stored at the storage device 1300 on the RAM 1200 and may process data loaded on the RAM 1200. The processor 1100 may store long-term data among data, stored at the RAM 1200, at the storage device 1300.

The storage device 1300 may include a nonvolatile memory such as for example flash memory, PRAM, MRAM, RRAM, and/or FRAM, or the like.

The modem 1400 may communicate with an external device under control of the processor 1100. For example, the modem 1400 may communicate with the external device in a wired or wireless manner. The modem 1400 may communicate with the external device, based on at least one of wireless communications manners such as for example long term evolution (LTE), WiMax, global system for mobile communication (GSM), code division multiple access (CDMA), Bluetooth, near field communication (NFC), Wi-Fi, and radio frequency identification (RFID), or the like, or wired communications manners such as for example universal serial bus (USB), SATA, HSIC, SCSI, Firewire, peripheral component interconnection (PCI), PCI express (PCIe), nonvolatile memory express (NVMe), universal flash storage (UFS), secure digital (SD), SDIO, universal asynchronous receiver transmitter (UART), serial peripheral interface (SPI), high speed SPI (HS-SPI), RS232, inter-integrated circuit (I2C), HS-I2C, integrated-interchip sound (I2S), Sony/Philips digital interface (S/PDIF), multimedia card (MMC), and embedded MMC (eMMC), or the like.

The user interface 1500 may communicate with a user under control of the processor 1100. For example, the user interface 1500 may include user input interfaces such as for example a keyboard, a keypad, buttons, a touch panel, a touch screen, a touch pad, a touch ball, a camera, a microphone, a gyroscope sensor, and a vibration sensor, or the like The user interface 150 may further include user output interfaces such as for example a liquid crystal display (LCD), an organic light-emitting diode (OLED) display device, an active matrix OLED (AMOLED) display device, a light-emitting diode (LED), a speaker, and a motor.

The storage device 1300 may include one of the storage devices 100, 200, and 300 according to embodiments of the inventive concept. Furthermore, the storage device 1300 may include one of the storage clusters 311 to 317 according to embodiments of the inventive concept. For example, when error correction decoding of each segment is completed, the storage device 1300 may send a corresponding segment to a host device. When error correction decoding of a current segment is not completed after a threshold time has elapsed after a previous segment has been completely transmitted, the storage device 1300 may output a dummy segment, which includes dummy data and an incorrect parity, to the host device. Accordingly, storage having a fast response property and improved reliability may be provided, and an operating speed and reliability of the computing device 1000 may be improved.

The processor 1100, the RAM 1200, the modem 1400, and the user interface 1500 may constitute a host device that communicates with the storage device 1300.

According to embodiments of the inventive concept, when error correction decoding of each segment is completed, a storage device may output a corresponding segment to an external host device. Accordingly, the storage device having an improved operating speed and an operating method thereof may be provided.

According to embodiments of the inventive concept, dummy data may be output to the external host device together with an incorrect error correction parity when error correction decoding of a current segment is not completed during a threshold time after a previous segment is output to the external host device. The external host device may request the storage device to retransmit a corresponding segment based on the incorrect error correction parity and the external host device may be prevented from obtaining incorrect data from the storage device. Accordingly, the storage device having a more improved operating speed while maintaining reliability and an operating method thereof may be provided.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A storage device, comprising:
a nonvolatile memory device; and
a controller configured to read data from the nonvolatile memory device, to divide the read data into a plurality of segments, and to sequentially perform error correction decoding on the plurality of segments,
wherein upon determination that error correction decoding of a first segment from among the plurality of segments is completed, the controller is configured to add first error correction parity to the first segment and send the first segment with the added first error correction parity to an external host device, and
wherein upon determination that error correction decoding of a second segment from among the plurality of segments is not complete after a threshold time has elapsed from when sending of the first segment from among the plurality of segments was completed, the controller is configured to add an incorrect error correction parity to dummy data and send the dummy data with the added incorrect error correction parity to the external host device.

2. The storage device of claim 1, wherein upon determination that the error correction decoding of the second segment is completed after sending of the dummy data with the added incorrect error correction parity, the controller is configured to add second error correction parity to the second segment and to send the second segment with the added second error correction decoding to the external host device.

3. The storage device of claim 2, wherein the controller is configured to send the second segment with the added second error correction parity in response to a retransmission request received from the external host device after sending of the dummy data with the added incorrect error correction parity.

4. The storage device of claim 1, wherein the first error correction parity is used for correcting errors arise from communication between the controller and the external host device.

5. The storage device of claim 1, wherein the controller is configured to receive a read command and an address from the external host device through input/output lines and to send the plurality of segments to the external host device through the input/output lines.

6. The storage device of claim 5, wherein the controller is configured to receive a chip enable signal, a write enable signal, a read enable signal, and an address latch enable signal from the external host device, and
wherein the controller is configured to output a ready/busy signal to the external host device.

7. The storage device of claim 1, wherein the nonvolatile memory device is configured to perform a read operation by a unit of a page at one time, and
wherein the page corresponds to the plurality of segments.

8. The storage device of claim 1, wherein upon determining that the error correction decoding of a first segment from among the plurality of segments is completed, the controller is configured perform error correction encoding to generate the first error correction parity.

9. The storage device of claim 1, wherein the error correction decoding of the first segment is used for detecting and correcting errors arise from reading the data.

10. A storage device, comprising:
a plurality of storage clusters;
a random access memory; and
a mass controller configured to control the plurality of storage clusters,
wherein each of the plurality of storage clusters comprises a plurality of nonvolatile memory devices, and
a controller configured to read data from each of the plurality of nonvolatile memory devices, to divide the read data into a plurality of segments, and to sequentially perform error correction decoding on the plurality of segments,
wherein upon determination of error correction decoding of a first segment from among the plurality of segments was completed, the controller is configured to add first error correction parity to the first segment from among the plurality of segments and send the first segment with the added first error correction parity to the mass controller, and
wherein upon determination that error correction decoding of a second segment is not complete after a threshold time has elapsed from when sending of the first segment was completed, the controller is configured to add an incorrect error correction parity to dummy data and send the dummy data with the added incorrect error correction parity to the mass controller.

11. The storage device of claim 10, wherein each of the plurality of storage clusters comprise:
    a first error correction code block configured to perform the error correction decoding; and
    a second error correction code block configured to generate the first error correction parity.

12. The storage device of claim 10, wherein the mass controller is configured to select a target storage cluster from among the plurality of storage clusters to which an access request received from an external host device is to be provided, based on an address of the access request.

13. The storage device of claim 10, wherein the controller is configured to convert an address transmitted from the mass controller into physical addresses of the plurality of nonvolatile memory devices.

14. The storage device of claim 10, wherein the mass controller is configured to request a retransmission of the second segment based on the incorrect error correction parity, and
    wherein upon determination that error correction decoding of the second segment is completed, in response to the request, the controller is configured to add second error correction parity to the second segment and send the second segment with the added second error correction parity to the mass controller.

15. The storage device of claim 10, wherein the first error correction parity is used for correcting errors arise from communication between the controller and the mass controller.

16. The storage device of claim 10, wherein the error correction decoding of the first segment is used for detecting and correcting errors arise from reading the data.

17. The storage device of claim 10, wherein the plurality of segments correspond to a page which are read by the controller at one time.

18. An operating method of a storage device that comprises a nonvolatile memory device and a controller configured to control the nonvolatile memory device, the method comprising:
    reading a plurality of segments from the nonvolatile memory device at the controller;
    performing error correction decoding sequentially on the plurality of segments at the controller;
    upon determination by the controller that error correction decoding of a first segment is complete, sending the first segment with first error correction parity to an external host device; and
    upon determination by the controller that error correction decoding of a second segment is not complete after a threshold time has elapsed from when the first segment was sent to the external host device, sending dummy data and an incorrect error correction parity to the external host device.

19. The method of claim 18, further comprising:
    receiving at the controller a retransmission request from the external host device after the incorrect error correction parity is sent; and
    sending the second segment from the controller to the external host device in response to the retransmission request after the error correction decoding of the second segment is completed.

20. The method of claim 18, further comprising:
    performing error correction encoding to generate the first error correction parity at the controller.

* * * * *